United States Patent
Benoist et al.

(10) Patent No.: US 11,189,331 B1
(45) Date of Patent: Nov. 30, 2021

(54) MEMORY CELL ARRANGEMENT AND METHODS THEREOF

(71) Applicant: Ferroelectric Memory GmbH, Dresden (DE)

(72) Inventors: Antoine Benoist, Dresden (DE); Marko Noack, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 16/929,929

(22) Filed: Jul. 15, 2020

(51) Int. Cl.
*G11C 11/22* (2006.01)
*H01L 27/1159* (2017.01)

(52) U.S. Cl.
CPC ........ *G11C 11/2273* (2013.01); *G11C 11/223* (2013.01); *H01L 27/1159* (2013.01)

(58) Field of Classification Search
CPC ............. G11C 11/2273; G11C 11/223; H01L 27/1159
USPC ..................................................... 365/145
See application file for complete search history.

(56) References Cited

U.S. PATENT DOCUMENTS

| | | | |
|---|---|---|---|
| 5,719,520 A | 2/1998 | Au | |
| 6,479,862 B1 | 11/2002 | King | |
| 11,024,357 B1* | 6/2021 | Mizusaki | G11C 11/223 |
| 2005/0088878 A1 | 4/2005 | Eshel | |
| 2010/0085806 A1 | 4/2010 | Wang | |
| 2010/0258794 A1 | 10/2010 | Iwasaki | |
| 2019/0131347 A1* | 5/2019 | Lee | H01L 27/2409 |
| 2019/0273087 A1* | 9/2019 | Morris | G11C 11/2273 |
| 2020/0176610 A1* | 6/2020 | Lee | H01L 29/786 |
| 2021/0026601 A1* | 1/2021 | Kobayashi | G11C 7/1006 |
| 2021/0028180 A1* | 1/2021 | Yamaguchi | H01L 27/1159 |

OTHER PUBLICATIONS

Subthreshold Conduction, Mar. 21, 2020, p. 1 (Year: 2020).*
Massoud Pedram, "Leakage Power Modeling and Minimization", University of Southern California, Dept. of EE-Systems, Los Angeles, CA 90089, ICCAD 2004 Tutorial, www.ceng.usc.edu, Oct. 10, 2007, 43 pages.
Junction Leakage and Gidl, "Reverse Biased Diode Current (Junction Leakage)", https://asicsoc.blogspot.com/2008/04/reverse-biased-diode-current-junction.html last viewed on Jul. 15, 2020, 3 pages.

(Continued)

*Primary Examiner* — Fernando Hidalgo
(74) *Attorney, Agent, or Firm* — Hickman Becker Bingham Ledesma LLP; Malgorzata A. Kulczycka

(57) ABSTRACT

A memory cell arrangement is provided that may include: at least one memory cell and a read-out circuit. The memory cell includes a first terminal, a second terminal, a third terminal, and a field-effect transistor structure being connected to the first terminal, the second terminal, and the third terminal. The read-out circuit is configured to carry out a read-out operation to read out a memory state of the memory cell, the read-out operation including: providing a first voltage at the first terminal, a second voltage at the second terminal, and a third voltage at the third terminal such that the field-effect transistor structure is in a high-resistivity state and such that a leakage current through the first terminal and/or through the second terminal is generated, and sensing the leakage current to determine the memory state of the memory element.

37 Claims, 20 Drawing Sheets

(56) References Cited

OTHER PUBLICATIONS

Jan M Rabaey, Anantha Chandrakasan and Borivoje Nikolic, "Digital Integrated Circuits A Design Perspective", 2nd Edition, dated 2005, Prentice Hall, 448 pages (in 3 parts).
Rabaey et al., "Digital Integrated Circuits A Design Perspective", Prentice Hall, 2nd Edition, 448 pages, dated 2005.
BSIM4.2.1 MOSFET Model, Department of Electrical Engineering and Computer Sciences, University of California, Berkeley, dated 2001, 1 page.

* cited by examiner

602
Applying a first voltage at a first terminal, a second voltage at a second terminal and a third voltage at a third terminal of the memory cell such that the field-effect transistor structure is in a high-resistivity state and that a leakage current through the first terminal, through the second terminal, and/or through the third terminal is generated

604
Sensing the leakage current to determine the memory state of the memory cell

MEMORY CELL ARRANGEMENT AND METHODS THEREOF

TECHNICAL FIELD

Various aspects relate to a memory cell arrangement, and methods thereof, e.g., a method for reading a memory cell.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g., for writing (e.g., programming and/or erasing) and/or reading the respective memory cell or groups of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 6 shows a schematic flow diagram of a method for reading a memory cell, according to various aspects.

DESCRIPTION

Figure 1A:
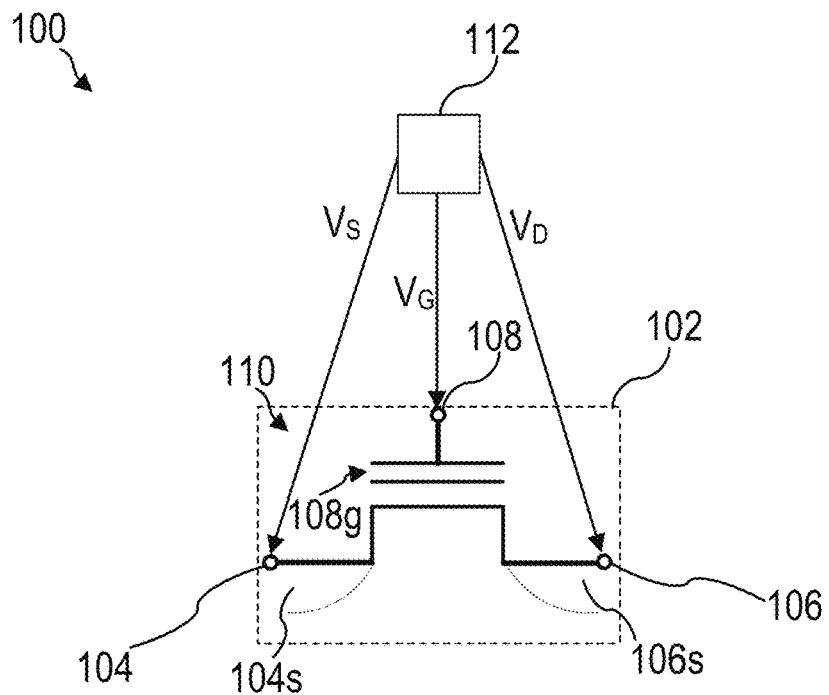
FIGS. 1A to 1H schematically show a memory cell arrangement, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e., one, two, three, four, [ . . . ], etc. The term "a plurality" may be understood to include any integer number greater than or equal to two, i.e., two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that that corresponding element of the second group of elements is unambiguously assigned to the element of the first group of elements.

The term "connected" may be used herein with respect to nodes, integrated circuit elements, terminals, control lines, and the like, to mean electrically connected, which may include a direct connection or an indirect connection, wherein an indirect connection may only include additional structures in the current path that do not influence the substantial functioning of the described circuit or device.

The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The phrase "a current between" a first terminal or node and a second terminal or node may be used herein to mean a current from the first terminal or node to the second terminal or node as well as a current from the second terminal or node to the first terminal or node.

The phrase "a current through" a terminal, node, or region may be used herein to mean a current from the terminal or node to another terminal, another node, or another region as well as a current to the terminal, node, or region (e.g., from another terminal, another node, or another region).

The term "voltage" may be used herein with respect to "one or more bitline voltages", "one or more wordline voltages", "one or more sourceline voltages", "one or more drainline voltages", "one or more control line voltages", "one or more base voltages" and the like. As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control line voltage" may be used herein to denote a voltage that is provided to a control line, e.g., of a memory cell arrangement (for example a "wordline voltage" may be provided to a "wordline", a "bitline voltage" may be provided to a bitline, and a "drainline voltage" may be provided to a drainline).

Illustratively, a voltage provided to a node or a terminal may assume any suitable value depending on the intended operation of the circuit including the node or terminal. For example, a gate voltage (referred to as $V_G$) may be varied depending on the intended operation of the memory cell arrangement. For example, a bitline voltage (referred to as $V_{BL}$) may be varied depending on the intended operation of the memory cell arrangement. Analogously, a wordline voltage (referred to as $V_{WL}$) may be varied depending on the intended operation of a memory cell arrangement. Analogously, a source voltage (referred to as $V_S$) and/or a drain voltage (referred to as $V_D$) of a memory cell may be varied depending on the intended operation of the memory cell. A voltage provided to a node or terminal may be defined by the respective potential applied to that node or terminal relative to the base voltage (referred to as $V_B$) of the circuit. Further, a voltage or voltage drop associated with two distinct nodes or terminals of a circuit may be defined by the respective voltages applied at the two nodes or terminals. As an example, the term "gate-source" voltage drop may be used to denote a voltage or voltage drop that is defined by respective voltages applied at a corresponding gate terminal and a corresponding source terminal, e.g., being part of a memory cell structure. The gate-source voltage drop may also be referred to as gate-source voltage, $V_{GS}$.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values are considered for the comparison.

According to various aspects, a memory cell may include a transistor. A transistor may include or may be, for example, a field effect transistor (FET), such as an n-type or p-type field-effect transistor, or the like. A transistor may have a threshold voltage associated therewith. A threshold voltage of a transistor (e.g., a field-effect transistor) may be defined by the properties of the transistor (e.g., the field-effect transistor), such as the material(s), the doping(s), etc., and it may thus be a (e.g., intrinsic) property of the transistor.

As an example, a memory cell (e.g., a memory cell including an n-type or p-type field-effect transistor (FET)) may have a first threshold voltage (e.g., a low threshold voltage ($V_{L-th}$)), and a second threshold voltage (e.g., a high threshold voltage ($V_{H-th}$)). The high threshold voltage, $V_{H-th}$, may be different from the low threshold voltage, $V_{L-th}$. In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g., the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g., the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g., the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g., the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

According to various aspects, a threshold voltage of a memory cell (e.g., a memory cell including a field-effect transistor) may be defined as a constant-current threshold voltage (referred to as $V_{th(ci)}$). In the case of the memory cell including a field-effect transistor, the constant-current threshold voltage, $V_{th(ci)}$, may be a determined gate-source voltage, $V_{GS}$ (in some aspects referred to as control voltage), at which a current (e.g., a drift current) from source to drain (referred to as $I_{SD}$) is equal to a predefined (constant) current. The predefined (constant) current may be a reference current (referred to as $I_{D0}$) times the ratio of gate width (W) to gate length (L) of the field-effect transistor. The magnitude of the reference current, $I_{D0}$, may be selected to be appropriate for a given technology, e.g. 0.1 µA. In some aspects, the constant-current threshold voltage, $V_{th(ci)}$, may be determined based on the following equation: $V_{th(ci)}=V_{GS}$ (at $I_{SD}=I_{D0} \cdot W/L$). According to various aspects, the drift current, $I_{SD}$, may be determined by use of a source-drain voltage, $V_{SD}$ (e.g., a source-drain voltage drop across a source region and a drain region of the field-effect transistor) of about 0.1 V.

According to various aspects, a drift current threshold voltage of a memory cell (e.g., a memory cell including a field-effect transistor) may be defined as a determined gate-source voltage, $V_{GS}$, at which a drift current (in some aspects referred to as $I_{SD}$) from source to drain is flowing. According to various aspects, substantially no drift (e.g., no substantial) current from source to drain is flowing for voltage values of the gate-source voltage, $V_{GS}$, lower than the drift current threshold voltage. For example, in the case that the field effect transistor is an n-type field-effect transistor, the drift current from source to drain is flowing in the case that a voltage value of the gate-source voltage, $V_{GS}$ is greater than the drift current threshold voltage. For example, in the case that the field effect transistor is an n-type field-effect transistor, the drift current from source to drain is flowing in the case that the voltage value of the gate-source voltage, $V_{GS}$, is more positive than the drift current threshold voltage. For example, in the case that the field effect transistor is a p-type field-effect transistor, the drift current from source to drain is flowing in the case that a voltage value of the gate-source voltage, $V_{GS}$, is less than the drift current threshold voltage. For example, in the case that the field effect transistor is a p-type field-effect transistor, the drift current from source to drain is flowing in the case that the voltage value of the gate-source voltage, $V_{GS}$, is more negative than the drift current threshold voltage. Illustratively, the field-effect transistor structure is closed for voltage values of the gate-source voltage, $V_{GS}$, lower than the drift current threshold voltage.

According to various aspects, a memory cell may have at least two distinct states associated therewith, for example with two distinct electrical conductivities that can be determined to evaluate in which of the at least two distinct states the memory cell is residing in. A memory cell in general may include a memory element (e.g., a memory layer), for example, a remanent-polarizable memory element, such as a ferroelectric or ferroelectric memory element. A memory cell may include remanent-polarizable portion, such as a ferroelectric portion. For example, the memory cell may include a ferroelectric field-effect transistor ("FeFET"). A memory cell may include a transistor that is coupled to a remanent-polarizable portion (e.g., the remanent-polarizable portion may be coupled to a gate or gate structure of the transistor). A memory cell may include at least a first memory state and a second memory state (e.g., a first memory state and a second memory state of the memory element). In some aspects, the memory state in which a memory cell is residing in may influence a current characteristic and/or voltage characteristic during readout of the memory cell. The first memory state may be, for example, associated with a logic "1" and the second memory state may be, for example, associated with a logic "0". However, the definition of the memory states and/or the definition of a logic "0" and a logic "1" may be selected arbitrarily.

A memory cell (for example a remanent-polarizable memory cell, such as a FeFET) may include a first memory state, e.g. a low threshold voltage state (referred to as LVT state), and a second memory state, e.g. a high threshold voltage state (referred to as HVT state).

According to various aspects, a remanent-polarizable memory cell may include a remanently-polarizable portion (also referred to as remanent-polarizable portion). The remanent-polarizable portion may be used to implement memory functions, e.g., in a memory cell. Therefore, according to various aspects, a memory cell may be implemented as a field-effect transistor structure, e.g., as a remanent-polarizable field effect transistor (e.g., a ferroelectric field effect transistor—"FeFET"). In general, a remanent polarization (also referred to as retentivity or remanence) may be present in a material portion (e.g., a material layer) in the case that the material may remain polarized upon reduction of an applied electric field, E, to zero; therefore, a certain value for the electrical polarization, P, of the material portion may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Further, a remanent-polarizable material may include a spontaneously polarization, for example, with reference to the polarization capability of a material beyond dielectric polarization. The coercivity of a material may be a measure of the strength of the reverse polarizing electric field that may be required to remove a remanent polarization. According to various aspects, an electric coercive field (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The polarization state of the remanent-polarizable portion may be switched by means of a capacitor structure that may be included in a transistor structure or coupled to a transistor (e.g., coupled to a field-effect transistor). The polarization state of the remanent-polarizable portion may be read out by means of the transistor structure. The polarization state of the remanent-polarizable portion may define a memory state, e.g., of a memory cell. As an example, the polarization state of the remanent-polarizable portion may influence one or more electrical characteristics of the transistor structure, e.g., a current flowing through the transistor structure. For example, the polarization state of the remanent-polarizable portion may influence a threshold voltage of the transistor structure.

According to various aspects, writing a memory cell or performing a write operation of a memory cell may include an operation or a process that modifies the memory state the memory cell is residing in from a (e.g., first) memory state to another (e.g., second) memory state. For example, writing a memory cell may include bringing the memory cell into the first memory state or into the second memory state. As an example, the first memory state may be associated with a logic "1" and the second state may be associated with a logic "0". However, the definition of first memory state and second memory state may be selected arbitrarily. For example, writing a remanent-polarizable memory cell may modify the polarization state of the remanent-polarizable memory cell from the first polarization state to the second polarization state (e.g., opposite to the first polarization state), or vice versa.

According to various aspects, a memory cell may include a transistor structure that is coupled to or includes a ferroelectric material as a remanent-polarizable portion (e.g., a ferroelectric field-effect transistor, "FeFET"). The term "ferroelectric" may be used herein, for example, to describe a material that shows a hysteretic charge voltage relationship (Q-V). The ferroelectric material may be or may include ferroelectric $HfO_2$ and/or $ZrO_2$. Ferroelectric $HfO_2$ may include any form of hafnium oxide that may exhibit ferroelectric properties. This may include, for example, $HfO_2$, $ZrO_2$, or a solid solution of $HfO_2$ and $ZrO_2$ (e.g., but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable portion. According to various aspects, a ferroelectric portion may be an example of a remanent-polarizable portion.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on a memory cell arrangement as described below. The memory cell arrangement may include ferroelectric memory cells. Since a ferroelectric material included in a ferroelectric memory cell may have at least two stable polarization states, the ferroelectric transistor may be used as a non-volatile memory cell. Thus, a ferroelectric memory cell may store data by means of a ferroelectric material between at least a first electrode and a second electrode of a gate structure or a capacitor structure. According to various aspects, a non-volatile field-effect transistor based memory structure, memory element, or memory cell may store data for a period of time from hours (e.g., more than 5 hours) to several tens of years (e.g., 10 years, 20 years, etc.), whereas a volatile memory cell may store data for a period of time from nanoseconds to hours (e.g., less than 5 hours).

In comparison to other emerging memory technologies, a ferroelectric memory cell may be integrated in the Front-End-of-Line (FEoL) and/or in the Back-End-of-Line (BEoL) process flow, since it may be implemented as a transistor-type of memory. Accordingly, the integration of the ferroelectric memory cell may comply with a standard FEoL and/or BEoL complementary metal-oxide-semiconductor (CMOS) process flow. Consequently, various different integration schemes may be used to integrate a ferroelectric memory cell in different process technologies, e.g., gate-first technologies, gate-last technologies, fully-depleted silicon-on-insulator (FDSOI) technologies, Fin-FET technologies, nanosheet technologies, nanowire technologies, as examples.

A ferroelectric memory cell may include a ferroelectric field-effect transistor (e.g., a field-effect transistor structure having a ferroelectric gate isolation, in some aspects referred to as "FeFET") or a field-effect transistor having a ferroelectric memory structure (e.g., a ferroelectric capacitor, in some aspects referred to as "FeCAP") coupled to a gate of the field-effect transistor.

In some aspects, a memory cell arrangement (e.g., an array including a plurality of memory cells) may be operated based on one or more write operations and/or one or more readout operations. During a write operation, as example, predefined voltages may be provided to electrical lines (also referred to as control lines or driver-lines), wherein the electrical lines may be connected to the respective nodes (e.g., respective electrodes) of the memory cells to allow for the desired operation. The electrical lines may be referred to, for example, as bitlines, wordlines, drainlines, and/or sourcelines. All memory cells that are not intended to be written may see a voltage that is at least less than the programming voltage. The programming voltage may be defined by the type and/or design of memory cell. The programming voltage may be determined via one or more electrical measurements. Various timings may be used to provide the respective voltages, e.g., to provide the desired write voltages and/or the desired readout voltages.

In general, a memory cell arrangement may include a plurality of (e.g., volatile or non-volatile) memory cells, which may be accessed individually or on groups via a corresponding addressing scheme. The matrix architecture may be, for example, referred to as "OR", "AND", "NOR", or "NAND" architecture, depending on the way neighboring memory cells are connected to each other, i.e., depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells. A memory cell (e.g., a single memory cell of the memory cell arrangement) may be written from one of at least two memory states into another one of the at least two memory states of the memory cell.

In general, memory cells including a field-effect transistor structure may be read out using a flowing drift current through the field-effect transistor structure (e.g., through a channel region of the field-effect transistor structure). For example, the drift current may flow from a first terminal of the memory cell through the field-effect transistor structure to a second terminal of the memory cell, or vice versa. The drift current may be detected using a current sense amplifier that outputs a voltage proportional to the drift current. The drift current may depend on a memory state of the memory cell such that a memory state of the memory state may be determined by sensing the drift current. The drift current may further depend on the dimensions of the field-effect transistor structure. In consequence, due to dimension variations, a memory cell arrangement that includes a plurality of memory cells may have different current/voltage characteristics for one or more of the memory cells. Recently, there is a need for smaller devices, however, in the case of small dimension of the field-effect transistor structure, the memory state of one or more memory cells cannot be clearly determined based on the drift current.

Besides the flowing drift current, various types of leakage currents are known to occur in field-effect transistor structures. Recent approaches consider these leakage currents trying to reduce one or more of the leakage currents.

Various aspects are related to a read-out of a memory cell exploiting a leakage current. In some aspects, a memory state of a memory cell may be determined while substantially no drift current is flowing through the field-effect transistor structure. According to various aspects, a leakage current representing the memory state of the memory cell may occur while substantially no drift current is flowing through the field-effect transistor structure and the memory state of a memory cell may be determined based on the leakage current. For example, the leakage current may be sensed at a terminal or node of the memory cell and the memory state of a memory cell may be determined based on the sensed leakage current. Illustratively, the leakage current present at/within the field-effect transistor structure may be a function of the memory state of the memory cell. According to various aspects, the leakage current may be substantially independent of the dimensions of the field-effect transistor structure. This may allow for using field-effect transistor structures with smaller dimensions (e.g., having one or more lateral dimension less than 200 nm) as compared to approaches that sense a flowing drift current, and, hence, smaller and/or more efficient memory devices can be manufactured.

FIGS. 1A to 1H illustrate schematically an exemplary memory cell arrangement 100, according to various aspects.

With respect to FIG. 1A, the memory cell arrangement 100 may include at least one memory cell 102. The memory cell 102 may be configured as a non-volatile memory cell. The memory cell 102 may have at least three terminals, including, for example, a first terminal 104 (e.g., a source terminal), a second terminal 106 (e.g., a drain terminal), and a third terminal 108 (e.g., a gate terminal). The memory cell 102 may include a field-effect transistor structure 110. The field-effect transistor structure 110 may include a first source/drain region 104s (e.g., a source region). The first source/drain region 104s may be connected to the first terminal 104 of the memory cell 102. The field-effect transistor structure 110 may include a second source/drain region 106s (e.g., a drain region). The second source/drain region 106s may be connected to the second terminal 106 of the memory cell 102. The field-effect transistor structure 110 may include a gate structure 108g (e.g., a gate region). The gate structure 108g may be connected to the third terminal 108 of the memory cell 102. According to various aspects, the gate structure 108g may include a memory element (see, for example, FIGS. 2A to 2I).

According to various aspects, the memory cell arrangement 100 may include a read-out circuit 112. The read-out circuit 112 may be any type of circuit and may include any kind of elements such that the read-out circuit is capable to carry out at least the read-out operation as described herein. The read-out circuit 112 may be configured to provide a first voltage, $V_S$ (in some aspects referred to as source voltage), at the first terminal 104. The read-out circuit 112 may be configured to provide a second voltage, $V_D$ (in some aspects referred to as drain voltage), at the second terminal 106. The read-out circuit 112 may be configured to provide a third voltage, $V_G$ (in some aspects referred to as gate voltage), at the third terminal 108.

Figure 1B:
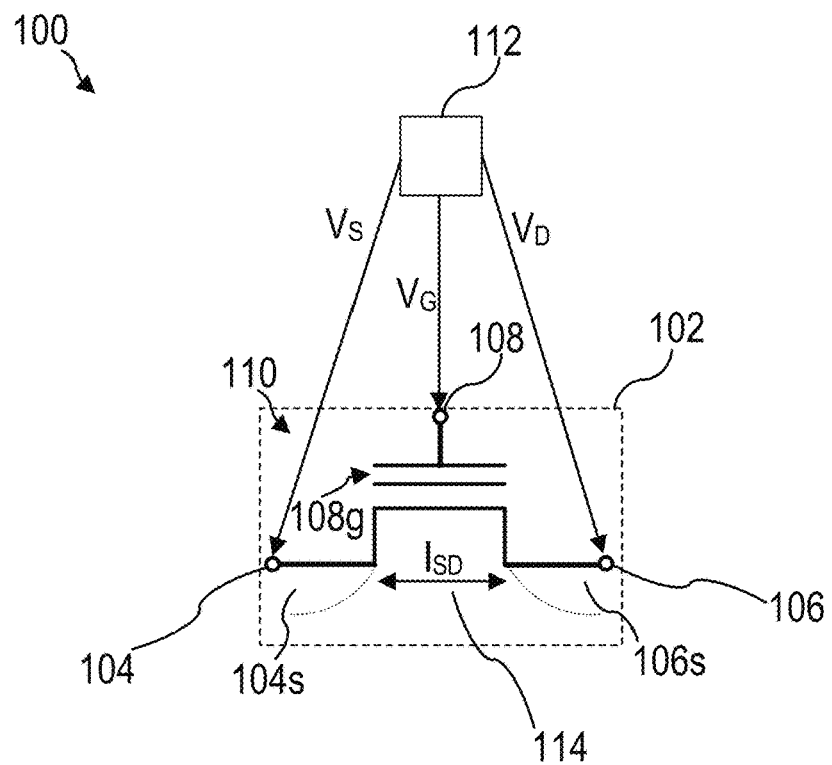

With respect to FIG. 1B, the memory cell may be configured to control (e.g., allow or prevent) a drift current flow, $I_{SD}$, between the first terminal and the second terminal (e.g., from the first terminal to the second terminal, e.g., from the second terminal to the first terminal) as a function of the first voltage, $V_S$, provided (e.g., applied, e.g., supplied) at the first terminal 104, the second voltage, $V_D$, provided at the second terminal 106, the third voltage, $V_G$, provided at the third terminal 108, and a memory state of the memory cell 102 (e.g., a state of a memory element). The field-effect transistor structure 110 may include a channel region 114. The channel region 114 may be disposed between the first source/drain region 104s and the second source/drain region 106s. The field-effect transistor structure 110 may be configured to control an electrical behavior of the channel region 114. The electrical behavior of the channel region 114 may be a function of the first voltage, $V_S$, provided at the first terminal 104, the second voltage, $V_D$, provided at the second terminal 106, the third voltage, $V_G$, provided at the third terminal 108, and a memory state of the memory cell 102. According to various aspects, the drift current, $I_{SD}$, may flow (or not flow) in the channel region 114 (e.g., from the first source/drain region 104s to the second source/drain region 106s, or vice versa) depending on the first voltage, $V_S$, provided at the first terminal 104, the second voltage, $V_D$, provided at the second terminal 106, the third voltage, $V_G$, provided at the third terminal 108, and a memory state of the memory cell 102.

The memory cell 102 may be writable into at least two memory states including a first memory state and a second memory state. The first memory state of the memory cell may be a low threshold voltage state (referred to as LVT state) of the field-effect transistor structure 110 and may have a first voltage (referred to as "low threshold" voltage), $V_{L-th}$, associated therewith. The second memory state of the memory cell 102 may be a high threshold voltage state (referred to as HVT state) of the field-effect transistor structure 110 and may have a second voltage (referred to as "high threshold" voltage), $V_{H-th}$, associated therewith that may be different from the low threshold voltage, $V_{L-th}$, associated with the LVT state (e.g., different absolute value and/or different signs as described above).

The respective threshold voltage ($V_{L-th}$ or $V_{H-th}$) may define a gate-source voltage, $V_{GS}$, (a voltage drop between the third terminal 108 of the memory cell 102 and the first terminal 104 of the memory cell 102) at which an electric drift current, $I_{SD}$, may flow from the first terminal 104 to the second terminal 106 that is equal to a reference current (as described above). The drift current, $I_{SD}$, may flow from the first terminal 104 to the second terminal 106 for absolute voltage values of the gate-source voltage, $V_{GS}$, greater than the respective threshold voltage (e.g., greater than the low threshold voltage, $V_{L-th}$, in the case that the memory cell 102 is residing in the first memory state, e.g., greater than the high threshold voltage, $V_{H-th}$, in the case that the memory cell 102 is residing in the second memory state). A drift current threshold voltage may define a gate-source voltage, $V_{GS}$, at which an electric drift current, $I_{SD}$, may flow (or below which an electric drift current, $I_{SD}$, may not flow) between the first terminal 104 and the second terminal 106. The drift current threshold voltage may correspond substantially to the respective threshold voltage, $V_{L-th}$ or $V_{H-th}$. In the case of a flowing drift current, $I_{SD}$, the field-effect transistor structure 110 may be in a low-resistivity state (e.g., the channel region 114 may have a low resistivity, in some aspects referred to as first resistivity state). The field-effect transistor structure may be switched between the low-resistivity state and the high-resistivity state as a function of one or more voltages applied at the first terminal, at the second terminal, and/or at the third terminal.

In some aspects, for absolute voltage values of the gate-source voltage, $V_{GS}$, lower than the respective threshold voltage (e.g., the low threshold voltage, $V_{L-th}$, in the case that the memory cell 102 is residing in the first memory state, e.g., the high threshold voltage, $V_{H-th}$ in the case that the memory cell 102 is residing in the second memory state) the field-effect transistor structure 110 may be in a high-resistivity state (e.g., the channel region 114 may have a high resistivity, in some aspects referred to as second resistivity state). For example, the field-effect transistor structure may be an n-type field-effect transistor (e.g., the channel region 114 may be p-type doped) and the field-effect transistor structure 110 may be in a high-resistivity state in the case that a voltage difference between the third voltage, $V_G$, and the first voltage, $V_S$, is more negative than a voltage value of the respective threshold voltage and that a voltage difference between the third voltage, $V_G$, and the second voltage, $V_D$, is more negative than the voltage value of the respective threshold voltage. For example, the field-effect transistor structure may be a p-type field-effect transistor (e.g., the channel region 114 may be n-type doped) and the field-effect transistor structure 110 may be in a high-resistivity state in the case that a voltage difference between the third voltage, $V_G$, and the first voltage, $V_S$, is more positive than a voltage value of the respective threshold voltage and that a voltage difference between the third voltage, $V_G$, and the second voltage, $V_D$, is more positive than the voltage value of the respective threshold voltage.

According to various aspects, substantially no drift current, $I_{SD}$, occurs (e.g., flows between the first terminal 104 and the second terminal 106) in the case that the field-effect transistor structure 110 is in the high-resistivity state. According to various aspects, the channel region 114 may be substantially non-conductive (e.g., the channel region 114 may be in a non-conductive state) in the case that the field-effect transistor structure 110 is in the high-resistivity state. In the non-conductive state, a resistance value associated with the channel region may be greater than 1 MΩ, for example. The resistance value associated with the channel region may be measured between first source/drain region 104*s* and the second source/drain region 106*s*, e.g., based on a measurement voltage of 100 mV or 1 V and a resulting current flow between the first source/drain region 104*s* and second source/drain region 106*s*.

Various leakage currents are known to occur (e.g., flow) in field-effect transistor structures, such as the field-effect transistor structure 110. According to various aspects, one or more of the following leakage currents may occur: a sub-threshold leakage current (e.g., a weak inversion current), a drift current between the first terminal 104 and the second terminal 106 (or vice versa), a drain-induced barrier lowering (DIBL) leakage current, a leakage current due to narrow channel effects, a gate-oxide tunneling leakage current, a leakage current due to hot carrier injection within the gate structure, a reverse bias leakage current, a gate-induced source leakage current (GISL), a gate-induced drain leakage current (GIDL), etc. For example, the first source/drain region 104*s* and/or the second source/drain region 106*s* may be n-doped (e.g., in the case of an n-type field-effect transistor structure) within a p-doped well region (for example, the p-doped well may provide the channel region 114) and a reverse bias leakage current may occur from the first source/drain region 104*s* and/or the second source/drain region 106*s* to the p-doped well region (e.g., due to band-to-band tunneling). For example, the field-effect transistor structure 110 may be disposed in a substrate and a gate-induced drain leakage current may occur from the second source/drain region 106*s* into the substrate. It is noted that these are only examples for leakage currents and one or more other types of leakage currents may occur within the field-effect transistor structure 110, e.g., at/within one or more of the first source/drain region 104*s*, the second source/drain region 106*s*, the gate structure 108*g*, and/or a bulk region (see, for example, FIG. 1G).

Figure 1C:
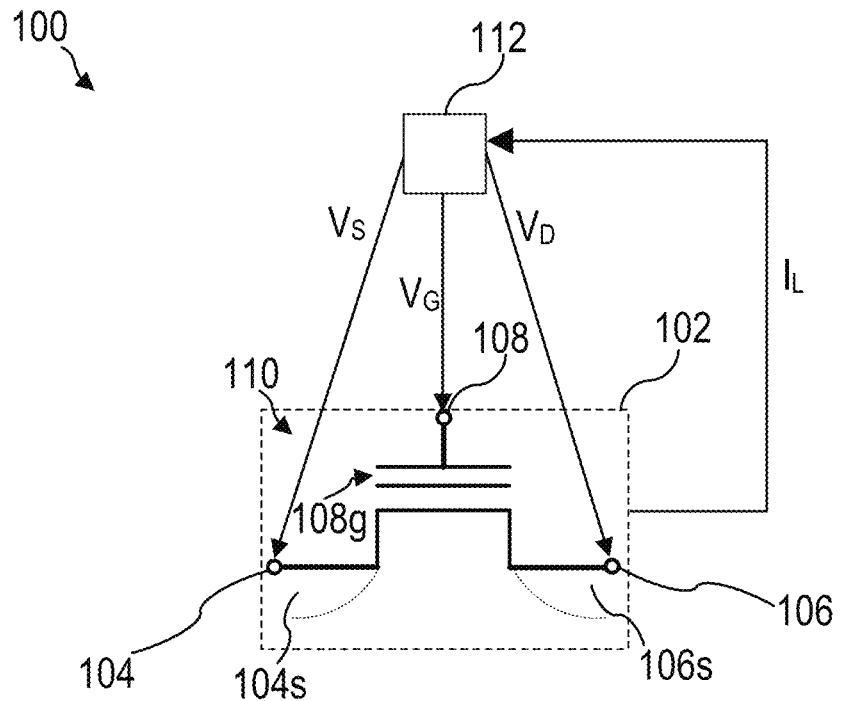

With respect to FIG. 1C, the read-out circuit 112 may be configured to provide the first voltage, $V_S$, at the first terminal 104, the second voltage, $V_D$, at the second terminal 106, and the third voltage, $V_G$, at the third terminal 108 such that the field-effect transistor structure 110 is in the high-resistivity state (e.g., such that substantially no drift current, $I_{SD}$, is flowing between the first terminal 104 and the second terminal 106, e.g., such that a drift current, $I_{SD}$, between the first terminal 104 and the second terminal 106 is prevented). The field-effect transistor structure 110 may be configured such that a leakage current, $I_L$, through the first terminal 104 (e.g., via the first source/drain region 104*s*) and/or through the second terminal 106 (e.g., via the second source/drain region 106*s*) generated in the case that the field-effect transistor structure 110 is in the high-resistivity state. The leakage current, $I_L$, may correspond to one or more of the above mentioned leakage currents and/or further leakage currents. For example, the leakage current, $I_L$, may be a sum of one or more leakage currents. The field-effect transistor structure 110 may be configured such that such that the memory state of the memory cell 102 does not change in the high-resistivity state (illustratively, such that the memory cell 102 is not written). The leakage current, $I_L$, may be less than the reference current associated with the drift current, $I_{SD}$.

The read-out circuit 112 may be further configured to provide the first voltage, $V_S$, at the first terminal 104, the second voltage, $V_D$, at the second terminal 106, and the third voltage, $V_G$, at the third terminal 108 such that the field-effect transistor structure 110 is in the high-resistivity state and that the leakage current, $I_L$, through the first terminal 104 and/or through the second terminal 106 is generated. The read-out circuit 112 may be further configured to sense the leakage current, $I_L$ (e.g., using a current sense amplifier). The read-out circuit 112 and/or another circuit may be configured to determine the memory state of the memory cell 102 based on the sensed leakage current, $I_L$ (e.g., provide a logic "1" for the first leakage current, $I_{L,LVT}$, and a logic "0" for the second leakage current, $I_{L,HVT}$, or vice versa).

FIGS. 1D to 1G illustrates the memory cell arrangement 100, wherein the memory cell arrangement 100 further includes at least one control line 116. The read-out circuit 112 may be configured to sense the leakage current, $I_L$, at (e.g., via) the control line 116.

Figure 1D:
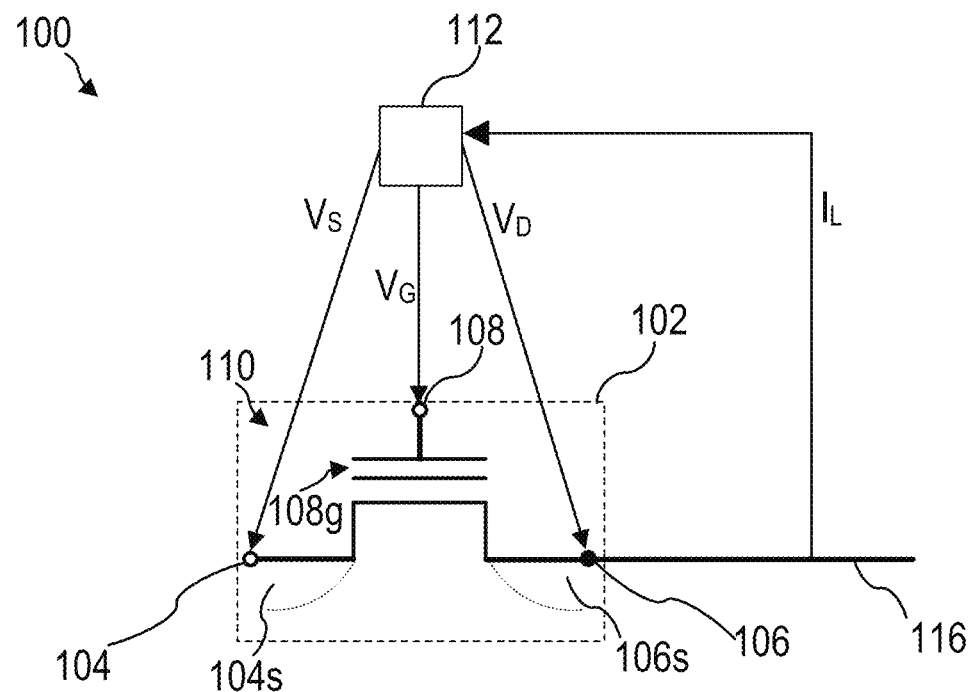

With respect to FIG. 1D, the control line 116 may be electrically conductively connected to the second terminal 106 and the read-out circuit 112 may be configured to sense the leakage current, $I_L$, through the second terminal 106 (e.g., through the second source/drain region 106*s*) via the control line 116.

Figure 1E:
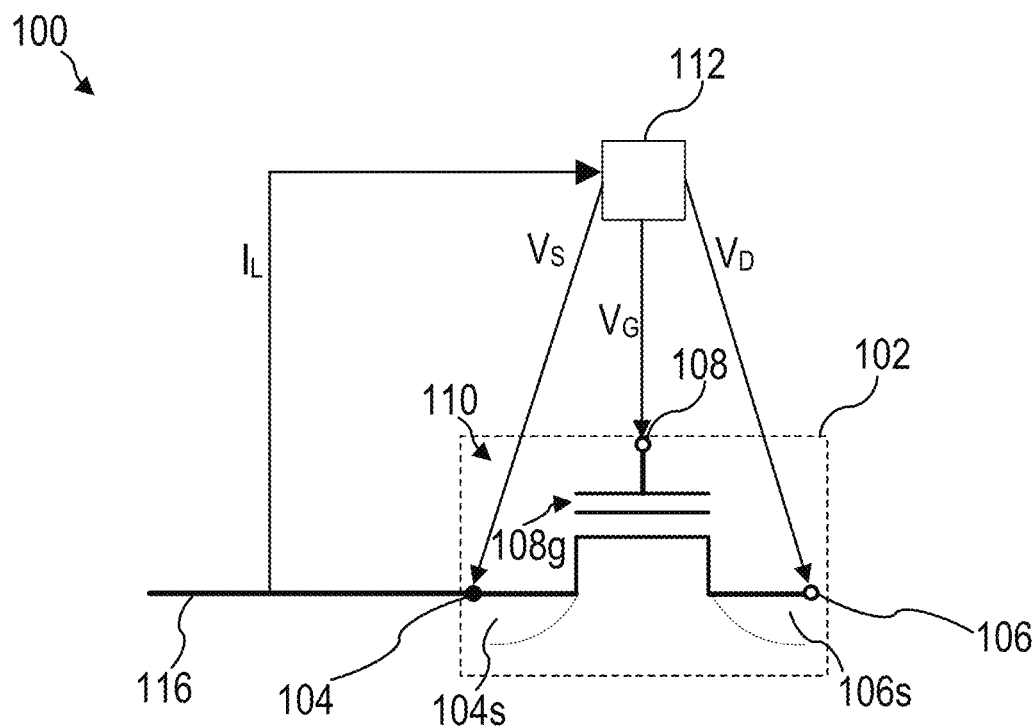

With respect to FIG. 1E, the control line 116 may be electrically conductively connected to the first terminal 104 and the read-out circuit 112 may be configured to sense the leakage current, $I_L$, through the first terminal 104 (e.g., through the first source/drain region 104*s*) via the control line 116.

Figure 1F:
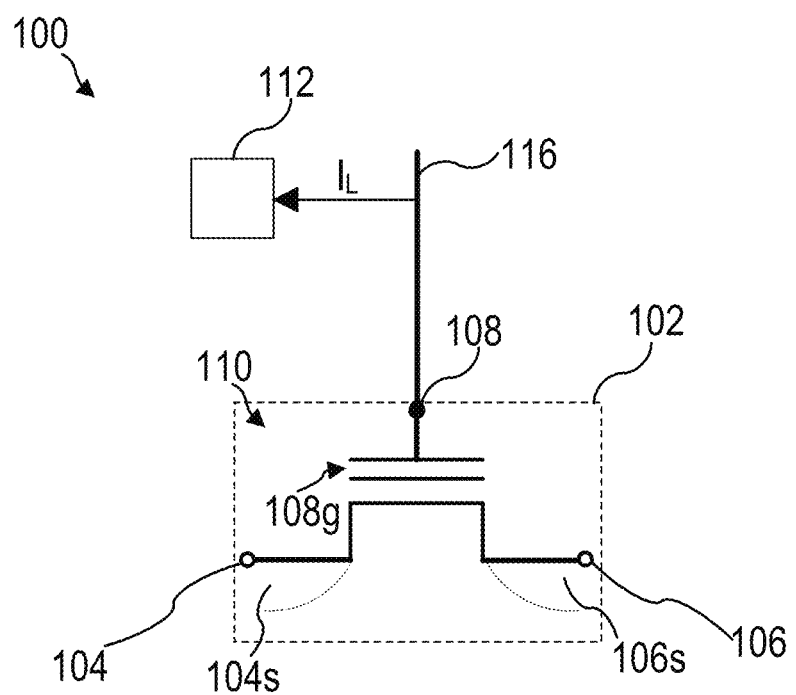

With respect to FIG. 1F, a control line 120 may be electrically conductively connected to the third terminal 108 to provide the third voltage, $V_G$, to the third terminal 108.

Figure 1G:
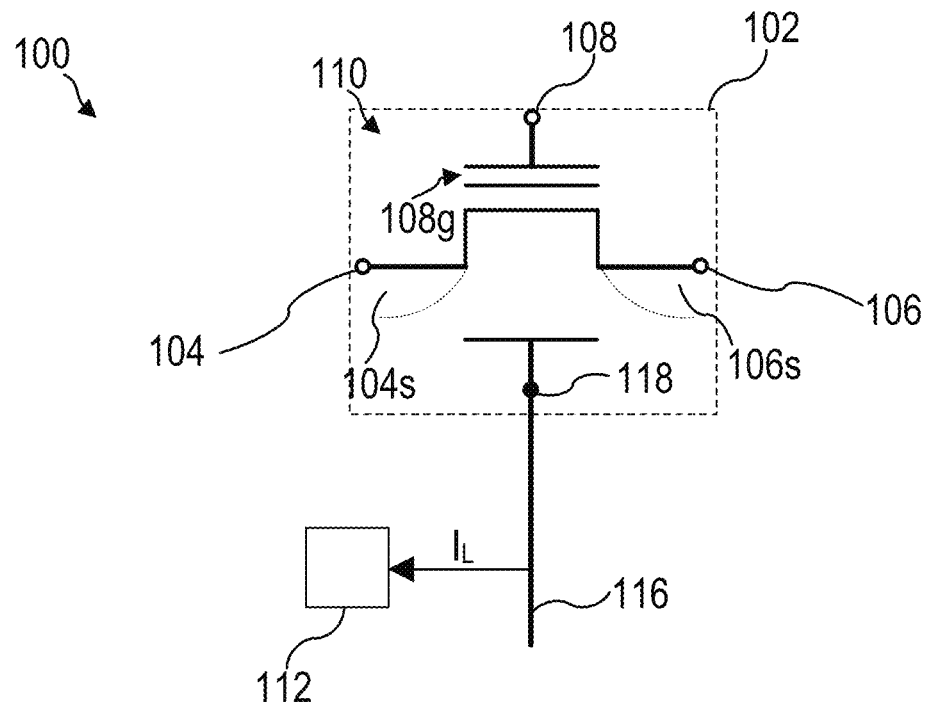

With respect to FIG. 1G, the memory cell arrangement 100 may further include a fourth terminal 118 (e.g., a bulk terminal). According to various aspects, the memory cell 102 may include the fourth terminal 118.

According to various aspects, the field-effect transistor structure 110 may include a bulk region connected to the fourth terminal 118. The bulk region may provide or may include the channel region 114. The control line 116 may be electrically conductively connected to the fourth terminal 118 and the read-out circuit 112 may be configured to sense the leakage current, $I_L$, through the fourth terminal 118 (e.g., through the bulk region of the field-effect transistor structure 110) via the control line 116.

According to various aspects, the read-out circuit 112 may be configured to sense the leakage current, $I_L$, through one or more of the first terminal 104, the second terminal 106, the gate terminal 108, and/or the fourth terminal 118. For example, read-out circuit 112 may be configured to sense one or more leakage current portions through the first terminal 104, the second terminal 106, the gate terminal 108, and/or the fourth terminal 118, and may be further configured to determine the leakage current, $I_L$, based on the sensed leakage current portions. For example, the read-out circuit 112 may be configured to sense a first leakage current portion, $I_1$, that flows through the first terminal 104 and a second leakage current portion, $I_2$, that flows through the second terminal 106. The read-out circuit 112 may be configured to determine the leakage current, $I_L$, based on (e.g., using) the sensed first leakage current portion and the sensed second leakage current portion (e.g., using a sum, $I_1+I_2$ of the first leakage current portion and the second leakage current portion). According to some aspects, the read-out circuit 112 may be configured to sense the first leakage current portion, $I_1$, at the first terminal 104 and to sense the second leakage current portion, $I_2$, at the second terminal 106. According to some aspects, the read-out circuit 112 may be configured to sense the sum, $I_1+I_2$, of the first leakage current portion, $I_1$, and the second leakage current portion, $I_2$, at the fourth terminal 118 (see, for example, FIG. 4I). According to various aspects, the first voltage, $V_S$, and the third voltage, $V_G$, may be selected such that a leakage current portion associated therewith is in a predefined range (e.g., greater than a threshold value). According to various aspects, the second voltage, $V_D$, and the third voltage, $V_G$, may be selected such that a leakage current portion associated therewith is in a predefined range (e.g., greater than a threshold value). According to various aspects, the first voltage, $V_S$, the second voltage, $V_D$, and the third voltage, $V_G$, may be selected such that the sum, $I_1+I_2$, of the first leakage current portion and the second leakage current portion is in a predefined range (e.g., greater than a threshold value).

According to various aspects, the read-out circuit 112 may be configured to compare the first leakage current portion, $I_1$, and second leakage current portion, $I_2$. For example, the read-out circuit 112 may be configured to determine a read-out error in the case that the first leakage current portion, $I_1$, and second leakage current portion, $I_2$, are of opposite sign and/or in the case that the first leakage current portion, $I_1$, and the second leakage current portion, $I_2$, differentiate from one another (e.g., differentiate by at least a predetermined voltage value). Sensing the first leakage current portion, $I_1$, and the second leakage current portion, $I_2$, may increase the reliability of the read-out operation.

According to various aspects, the read-out circuit 112 may be configured to carry out a read-out operation to read out the memory state of a memory cell 102 (e.g., the memory state of the memory element).

The read-out operation may include providing the first voltage, $V_S$, at the first terminal 104, the second voltage, $V_D$, at the second terminal 106, and the third voltage, $V_G$, at the third terminal 108 such that the field-effect transistor structure 110 is in the high-resistivity state and that the leakage current, $I_L$, through the first terminal 104, through the second terminal 106 and/or through the fourth terminal 118 is generated.

The read-out operation may include providing the gate-source voltage, $V_{GS}$, across the third terminal 108 and the first terminal 104. An absolute value of the provided gate-source voltage, $V_{GS}$ may be less than an absolute value of the low threshold voltage, $V_{L-th}$, and may be less than an absolute value of the high threshold voltage, $V_{H-th}$. According to various aspects, the leakage current, $I_L$, may be generated through the first terminal 104. The read-out operation may further include providing the second voltage, $V_D$, at the second terminal 106 such that the leakage current, $I_L$, is generated (e.g., through the second terminal 106 and/or through the first terminal 104).

The read-out operation may include providing the gate-source voltage, $V_{GS}$, across the third terminal 108 and the first terminal 104 such that the field-effect transistor structure 110 is in the high-resistivity state and that the leakage current, $I_L$, through the first terminal 104, through the second terminal 106, and/or through the fourth terminal 118 is generated.

The read-out operation may include providing the gate-source voltage, $V_{GS}$, across the third terminal 108 and the first terminal 104 and/or a source-drain voltage, $V_{SD}$, that drops across the first terminal 104 and the second terminal 106 such that substantially no drift current $I_{SD}$, between the first terminal 104 and the second terminal 106 is generated and that the leakage current, $I_L$, through the first terminal 104, through the second terminal 106, and/or through the fourth terminal 118 is generated.

The read-out operation may include providing the gate-source voltage, $V_{GS}$, across the third terminal 108 and the first terminal 104 and/or the source-drain voltage, $V_S D$, across the first terminal 104 and the second terminal 106 such that the leakage current, $I_L$, through the first terminal 104, through the second terminal 106, and/or through the fourth terminal 118 is greater than an absolute value of the drift current, IDS The read-out operation may further include sensing the leakage current, $I_L$, to determine the memory state of the memory cell 102.

According to various aspects, the read-out circuit 112 may be configured to sense the leakage current, $I_L$, and/or a respective leakage current portion (e.g., the first leakage current portion, $I_1$, and/or the second leakage current portion, $I_2$) through the first terminal 104 and/or through the second terminal 106. For example, in the case of sensing the leakage current, $I_L$, or the first leakage current portion through the first terminal 104, the first voltage, $V_S$, provided at the first terminal 104 may have an absolute voltage in a range from about 0.1 V to about 10 V (e.g., from about 0.1 V to about 5 V, e.g., from about 1 V to about 10 V, e.g., from about 1 V to about 5 V). For example, in the case of sensing the leakage current, $I_L$, or the second leakage current portion through the second terminal 106, the second voltage, $V_D$, provided at the second terminal 106 may have an absolute voltage in a range from about 0.1 V to about 10 V (e.g., from about 0.1 V to about 5 V, e.g., from about 1 V to about 10 V, e.g., from about 1 V to about 5 V). According to some aspects, the voltage values of the first voltage, $V_S$, provided at the first terminal 104 and/or the voltage values of the second voltage, $V_D$, provided at the second terminal 106 may be related to a voltage value present at (e.g., provided to, e.g., applied at) the bulk terminal 118.

According to some aspects, the voltage values of the first voltage, $V_S$, provided at the first terminal 104 may be related to a voltage value present at (e.g., provided to, e.g., applied at) the bulk terminal 118.

According to various aspects, the generated leakage current, $I_L$, may flow through the fourth terminal. For example, the leakage current, $I_L$, may flow from the first terminal to the fourth terminal, or vice versa. For example, the leakage current, $I_L$, may flow from the second terminal to the fourth terminal, or vice versa.

Figure 1H:
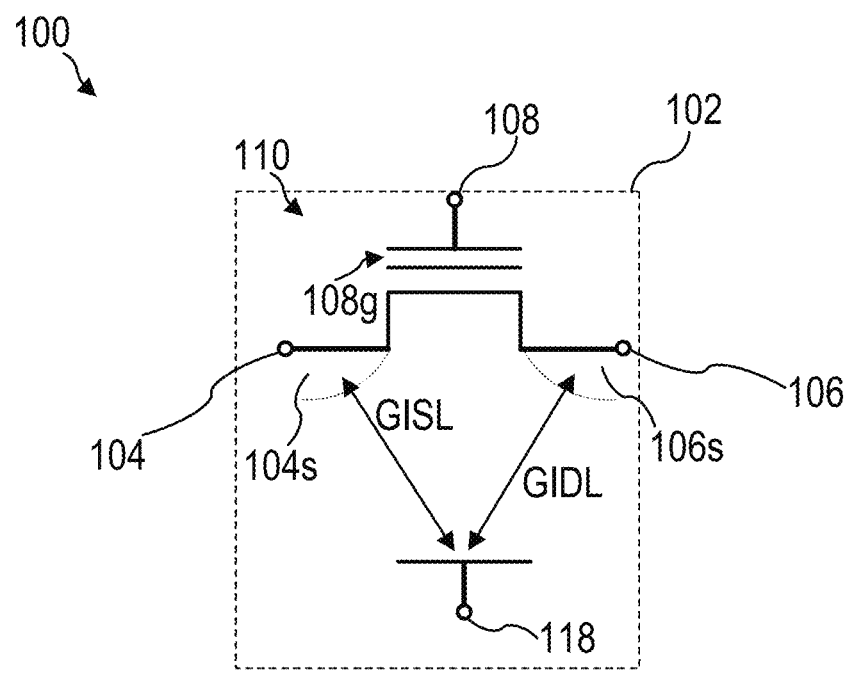

FIG. 1H illustrates schematically a memory cell arrangement 100 describing a leakage current, $I_L$, according to various aspects. As described above, leakage current, $I_L$, may include or may be a gate-induced source leakage current (GISL) and/or a gate-induced drain leakage current (GIDL). The GISL and/or the GIDL may be flowing in the case that the field-effect transistor structure 110 is in the high-resistivity state.

The GISL may flow between the first source/drain region 104s (e.g., a source region) of the field-effect transistor structure 110 and the bulk region of the field-effect transistor structure 110. The bulk region may be connected to the bulk terminal 118. The GISL may flow from the first source/drain region 104s to the bulk region in the case that an absolute value of the first voltage, $V_S$, applied at the first terminal 104 is greater than an absolute value of a voltage present (e.g., applied) at the bulk terminal 118. The GISL may flow from the bulk region to the first source/drain region 104s in the case that an absolute value of the first voltage, $V_S$, applied at the first terminal 104 is lower than an absolute value of a voltage present at the bulk terminal 118.

The GIDL may flow between the second source/drain region 106s (e.g., a drain region) of the field-effect transistor structure 110 and the bulk region of the field-effect transistor structure 110. The GIDL may flow from the second source/drain region 106s to the bulk region in the case that an absolute value of the second voltage, $V_D$, applied at the second terminal 106 is greater than an absolute value of a voltage present (e.g., applied) at the bulk terminal 118. The GIDL may flow from the bulk region to the second source/drain region 106s in the case that an absolute value of the second voltage, $V_D$, applied at the second terminal 106 is lower than an absolute value of a voltage present at the bulk terminal 118.

According to various aspects, either the GISL or the GIDL may be sensed at the respective terminal (e.g., at the first terminal 104 in the case of GISL, e.g., at the second terminal 106 in the case of GIDL) and/or at the bulk terminal 118.

According to various aspects, both, the GISL and the GIDL may be sensed as described above with respect to the first leakage current portion (e.g., a GISL portion) and the second leakage current portion (e.g., a GIDL portion). For example, a sum of the GISL portion and the GIDL portion may be sensed via the bulk terminal 118.

For example, the first voltage, $V_S$, applied at the first terminal 104 has a voltage value of about 0.4 V, the second voltage, $V_D$, applied at the second terminal 106 has a voltage value of about 1 V, and a fourth voltage, $V_B$, applied at the bulk terminal 118 has a voltage value of about 0 V. In this case, both the GISL and the GIDL may flow from the bulk region to the respective source/drain region.

For example, the first voltage, $V_S$, applied at the first terminal 104 has a voltage value of 0 V, the second voltage, $V_D$, applied at the second terminal 106 has a voltage value of about 1 V, and the fourth voltage, $V_B$, applied at the bulk terminal 118 has a voltage value of about 0 V. In this case, no substantial GISL may flow between the bulk region to the first source/drain region 104s, however, a GIDL may flow from the bulk region to the second source/drain region 106.

FIGS. 2A to 2I show exemplary configurations of a memory cell 102 in accordance with various aspects. The field-effect transistor structure 110 may be configured as a field-effect transistor structure 110-1, a field-effect transistor structure 110-2, and/or a field-effect transistor structure 110-3).

Figure 2A:
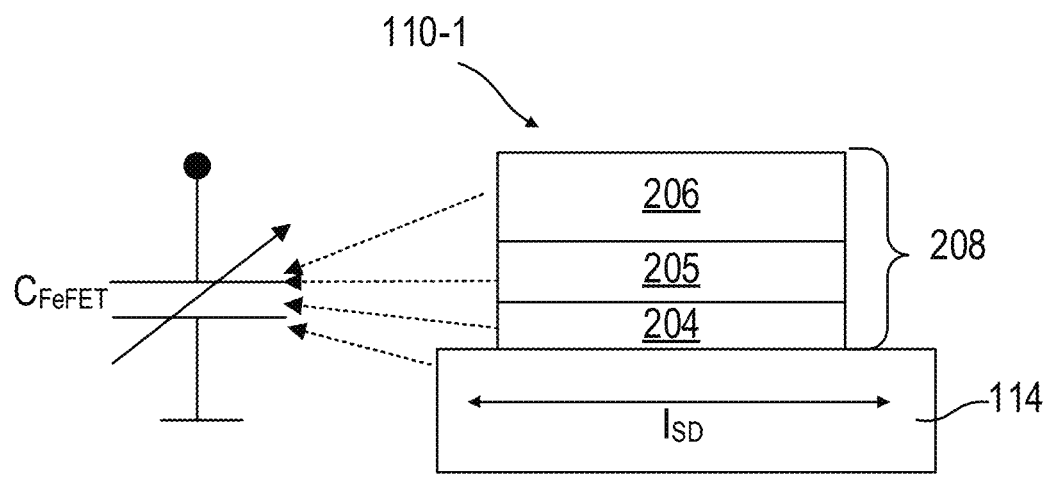
FIGS. 2A to 2I schematically show exemplary configurations of a memory cell, according to various aspects.
Figure 2B:
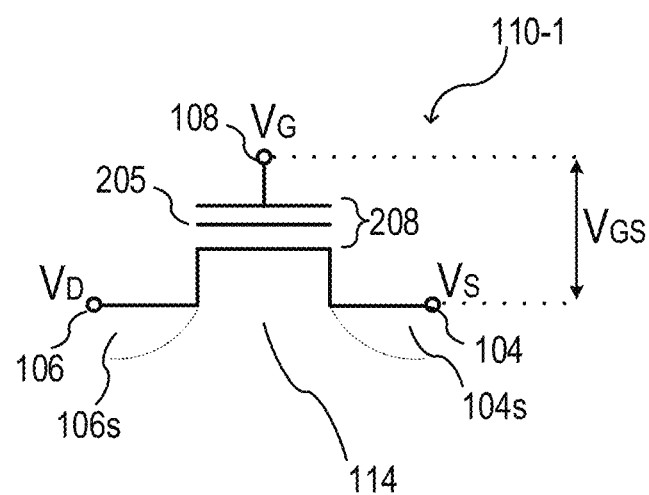
Figure 2C:
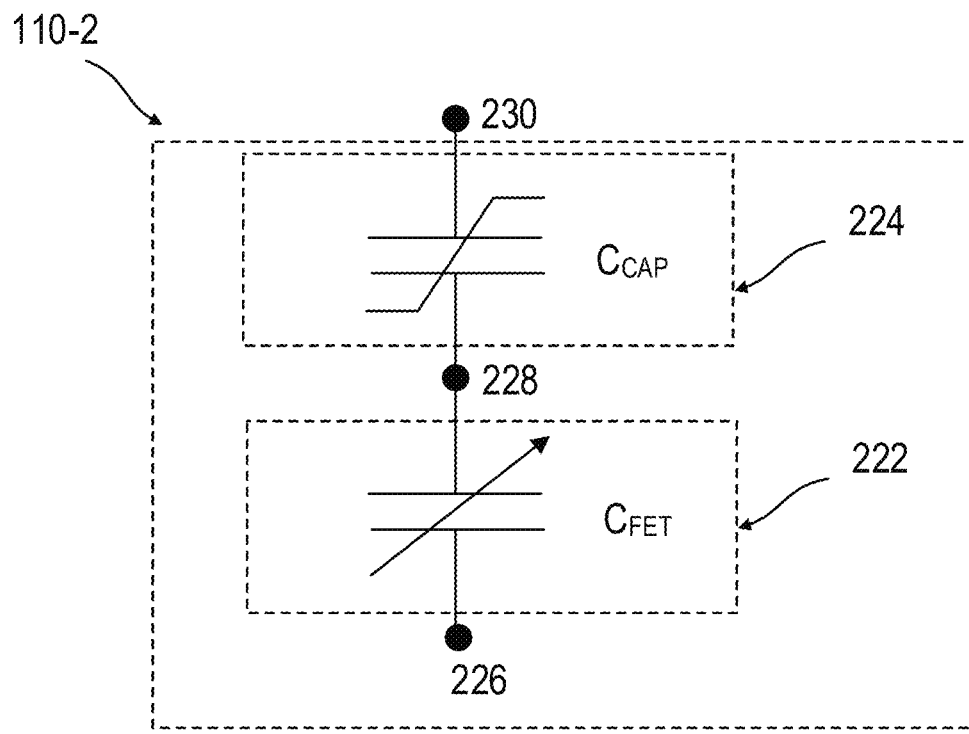
Figure 2D:
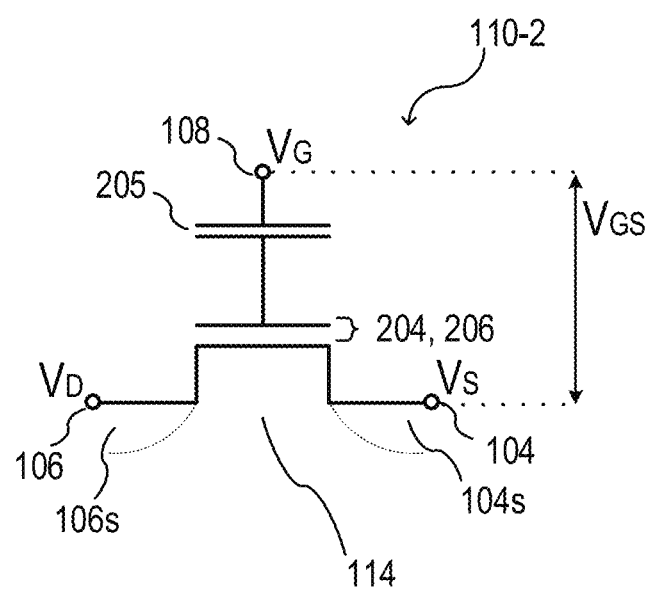
Figure 2E:
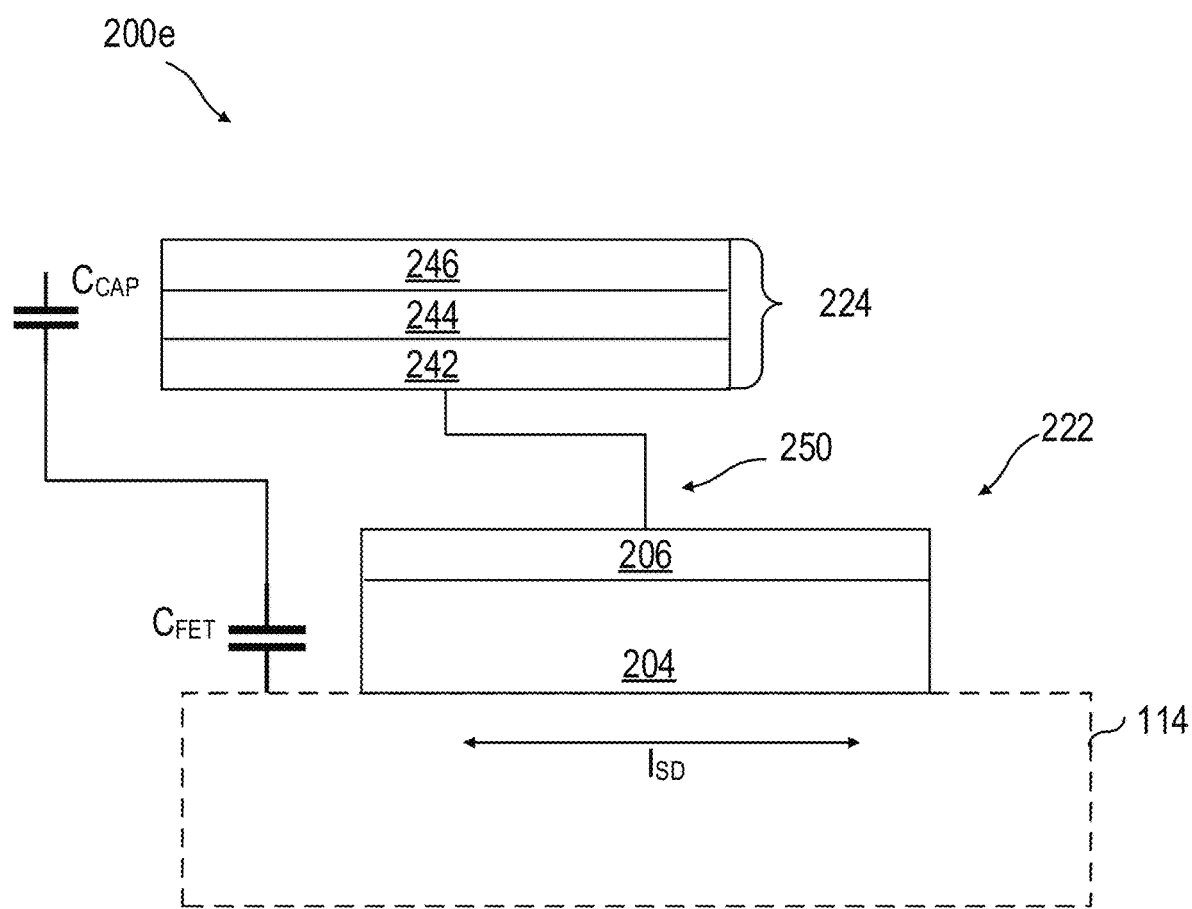
Figure 2F:
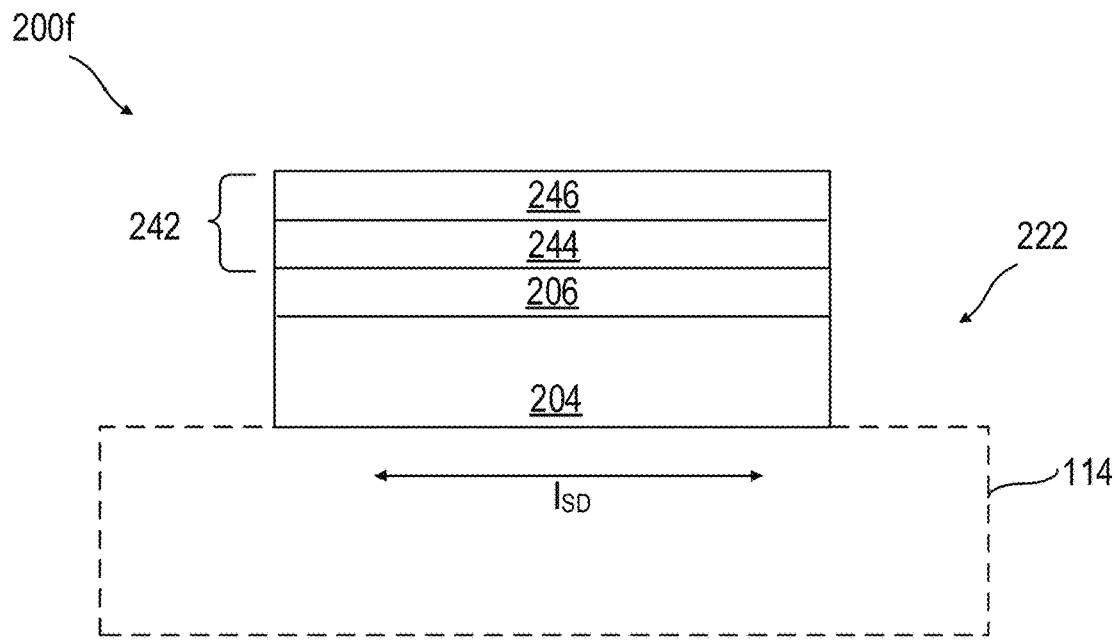
Figure 2G:
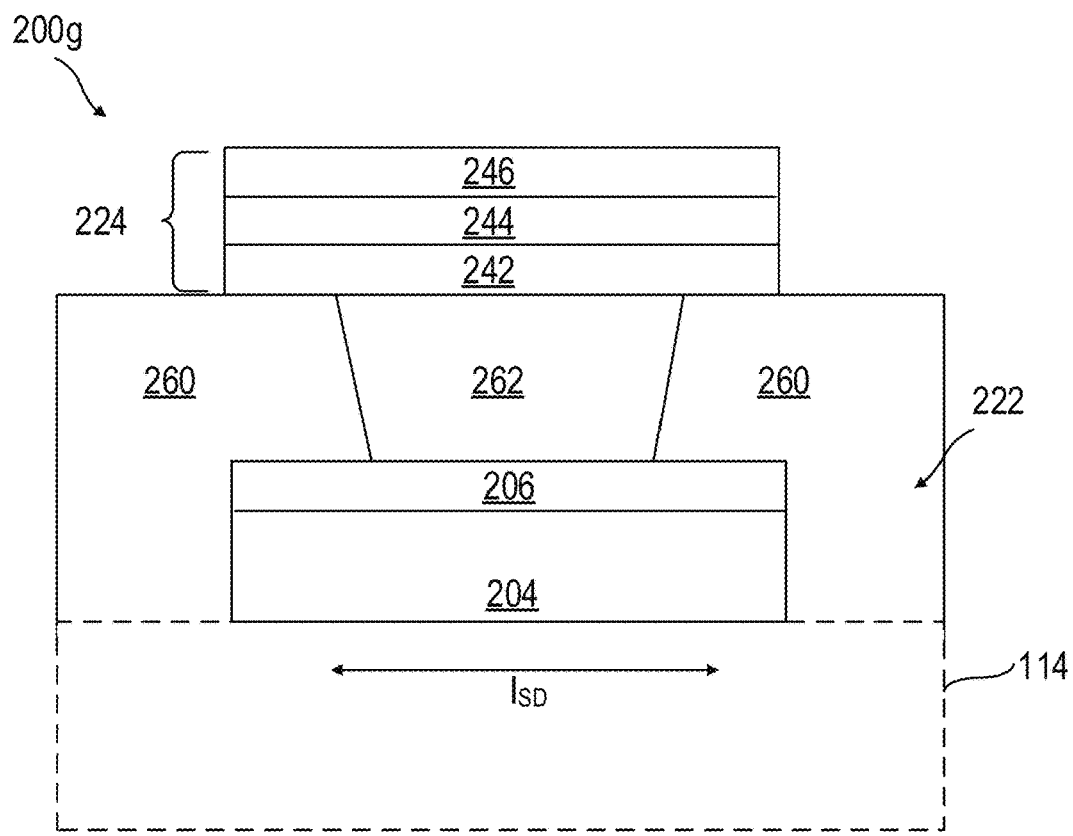
Figure 2H:
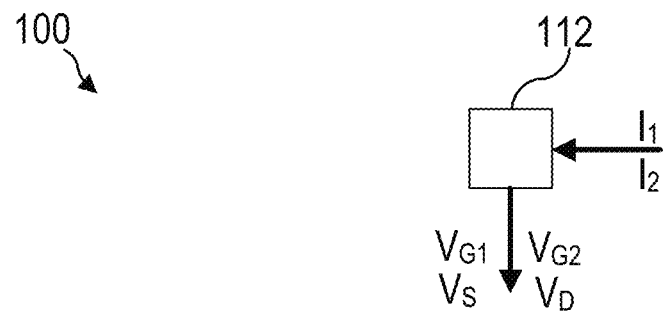
Figure 2I:
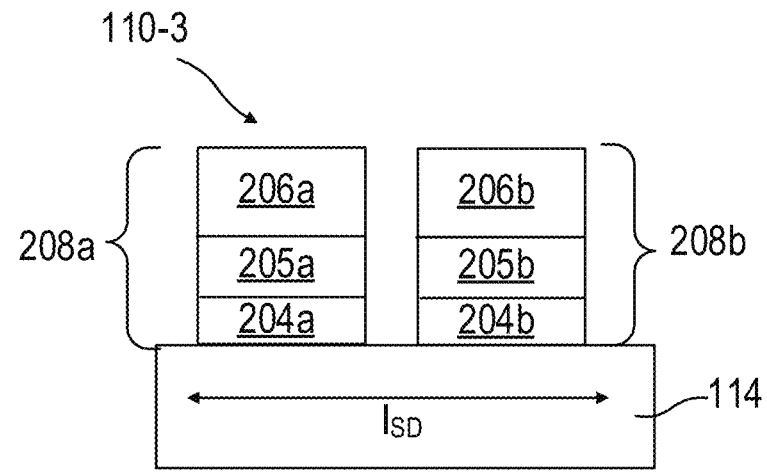

A memory cell 102 may be provided, for example, by integrating a memory structure in a gate element of the field-effect transistor structure 110 (see, for example, field-effect transistor structure 110-1 shown FIG. 2A and FIG. 2B and field-effect transistor structure 110-3 shown FIG. 2H and FIG. 2I), or by coupling a gate element of the field-effect transistor structure 110 with a capacitive memory structure (see, for example, field-effect transistor structure 110-2 shown FIG. 2C to FIG. 2G). According to various aspects, the gate element including the integrated memory structure and/or the gate element coupled with the capacitive memory structure may provide the gate structure 108g of the field-effect transistor structure 110. Various aspects may therefore provide a field-effect transistor structure adapted to memory-cell applications. According to various aspects, a field-effect transistor structure is described that is specifically adapted for memory-related applications, e.g., a field-effect transistor structure adapted for use in a (capacitor-based) memory cell (e.g., as illustrated in FIGS. 2C to 2G).

FIG. 2A shows a schematic functioning of a field-effect transistor structure 110-1, according to various aspects, and FIG. 2B shows an equivalent circuit in accordance therewith. The field-effect transistor structure 110-1 may be configured as a ferroelectric field-effect transistor. The field-effect transistor structure 110-1 may include a gate element 208 (e.g., providing the gate structure 108g), wherein the gate element 208 may include a memory element 205, and a gate electrode 206. According to various aspects, the gate element 208 may further include a gate isolation 204, wherein the memory element 205 may be disposed between the gate isolation 204 and the gate electrode 206. The gate isolation 204 may include a dielectric material. According to various aspects, the memory element 205 may be a remanent-polarizable layer (e.g., a ferroelectric layer). The gate element 208 is illustrated exemplarily as a planar gate stack, however, it may be understood that the planar configuration shown in FIG. 2A is an example, and other field-effect transistor designs may include a gate element 208 with a non-planar shape, for example a trench gate transistor design, a vertical field-effect transistor design, or other designs. The gate element 208 may define the channel region 114, e.g., provided in a semiconductor portion (e.g., in a semiconductor layer, in a semiconductor die, etc.). With respect to the operation of the field-effect transistor structure 110-1, a voltage (illustratively an electrical potential) may be provided at (e.g., supplied to) the gate electrode 206 to control the drift current flow, $I_{SD}$, in the channel region 114. The gate electrode 206 may be connected to the third terminal 108 of the memory cell 102. The gate electrode 206 may provide the third terminal 108 of the memory cell 102. A voltage may be provided at the gate electrode 206 via the third terminal 108, for example by applying a voltage (e.g., the third voltage, $V_G$) at the third terminal 108. According to various aspects, the electrical behavior of the channel region 114 may be influenced by the memory element 205 (e.g., by a polarized ferroelectric material, a charged layer, etc.).

According to various aspects, the first source/drain region 104s of the field-effect transistor structure 110-1 may provide the first terminal 104 of the memory cell 102. According to various aspects, the second source/drain region 106s of the field-effect transistor structure 110-1 may provide the second terminal 106 of the memory cell 102.

As illustrated by the circuit equivalent in FIG. 2A, the channel region 114, the gate isolation 204, the memory element 205, and the gate electrode 206 may have a capacitance, $C_{FeFET}$, associated therewith (e.g., a capacitance associated with the ferroelectric FET), originating from the more or less conductive regions (the channel region 114 and the gate electrode 206) separated from one another by the gate isolation 204 and/or the memory element 205. Illustratively, the channel region 114 may be considered as a first capacitor electrode, the gate electrode 206 as a second capacitor electrode, the gate isolation 204 as a dielectric medium between the two capacitor electrodes, and the memory element 205 as a ferroelectric capacitance, originating from the polarization of the memory element 205, influencing the above capacitance. The capacitance, $C_{FeFET}$, of the field-effect transistor structure 110-1 may define one or more operating properties of the field-effect transistor structure 110-1.

FIGS. 2C to 2G show a schematic functioning of a field-effect transistor structure 110-2, according to various aspects.

FIG. 2C shows a circuit equivalent of a memory cell 102 including the field-effect transistor structure 110-2. The field-effect transistor structure 110-2 may include a field-effect transistor structure 222. The field-effect transistor structure 222 may correspond substantially to the field-effect transistor structure 110-1 without the memory element 204. The field-effect transistor structure 110-2 may include a capacitive memory structure 224. The capacitive memory structure 224 may be coupled to the field-effect transistor structure 222 (in some aspects referred to as FeCAP-coupled FET), according to various aspects. The field-effect transistor structure 110-2 may have a first capacitance, $C_{FET}$, associated with the field-effect transistor structure 222 and the capacitive memory structure 224 may have a second capacitance, $C_{CAP}$, associated therewith.

The field-effect transistor structure 222 and the capacitive memory structure 224 may be coupled (e.g., electrically connected) to one another such that a capacitive voltage divider is provided. The channel region 114 of the field-effect transistor structure 222 may provide or may be connected to a first node 226, an electrode of the capacitive memory structure 224 may provide or may be connected to a second node 230 and an intermediate conductive portion (electrode, layer, etc.) may provide or may be connected to a floating intermediate node 228. Exemplary realizations of such connected structures will be described in further detail below, for example in relation to FIG. 2E to FIG. 2G.

The capacitive voltage divider formed by the field-effect transistor structure 222 and the capacitive memory structure 224 may allow adapting the capacitances $C_{FET}$, $C_{CAP}$ of the respective capacitors to allow an efficient programming of the capacitive memory structure 224. The overall third voltage, $V_G$, required for switching the memory cell 102 from one memory state into another memory state (e.g., from high threshold voltage state to low threshold voltage state, as described below), may become smaller in case the voltage distribution across the field-effect transistor structure 222 and the capacitive memory structure 224 is adapted such that more of the applied gate voltage drops across the functional layer of the capacitive memory structure 224 (e.g., across a remanent-polarizable layer, such as a ferroelectric layer) than across the gate isolation of the field-effect transistor structure 222. The overall write voltage (illustratively, applied via the nodes 226, 230 to which the field-effect transistor structure 222 and the capacitive memory structure 224 are connected) may thus be reduced by adapting the capacitive voltage divider. The voltage distribution may be determined by voltage divider calculations for a series connection of the capacitors.

FIG. 2D shows an equivalent circuit of an exemplary field-effect transistor structure 110-2, and FIG. 2E to FIG. 2G illustrate schematically possible realizations of a respective memory cell 200e, 200f, 200g.

Each of the described memory cells 200e, 200f, 200g may include a field-effect transistor structure 222 including a channel region 114, a gate isolation 204, and a gate electrode 208.

Each of the described memory cells 200e, 200f, 200g may include a capacitive memory structure 224 electrically connected (in other words, electrically coupled) with the field-effect transistor structure 222. The capacitive memory structure 224 may include any type of planar or non-planar design with at least a first electrode 242, a second electrode 246 and a memory element 244 (e.g., at least one remanent-polarizable layer) disposed between the first electrode 242 and the second electrode 246, e.g., to provide memory functions. The memory element 244 may be configured as memory element 205.

In some aspects, the gate electrode 206 of the field-effect transistor structure 222 may be electrically conductively connected to the first electrode 242 of the capacitive memory structure 224 via an electrically conductive (e.g., ohmic) connection 250, as shown in FIG. 2E. In some aspects, the first electrode 242 of the capacitive memory structure 224 may be in direct physical contact with the gate electrode 206 of the field-effect transistor structure 222.

In some aspects, the capacitive memory structure 224 and the field-effect transistor structure 222 may share a common electrode acting as gate electrode of the field-effect transistor structure 222 and electrode of the capacitive memory structure 224, as shown in FIG. 2F.

In some aspects, the electrically conductive (e.g., ohmic) connection 250 between the field-effect transistor structure 222 and the capacitive memory structure 224 may be provided by one or more metallization structures 260, 262 disposed over the field-effect transistor structure 222, as shown in FIG. 2G.

In some aspects, non-planar structures for a memory cell (e.g., a non-planar FeFET or a memory cell including at least one of a non-planar field-effect transistor structure or a non-planar memory element) may be possible as well.

FIG. 2H schematically shows a memory cell arrangement 100, according to various aspects. FIG. 2B shows a schematic functioning of a field-effect transistor structure 110-3, according to various aspects. The gate structure 108 may include a first gate element 208a and a second gate element 208b. The first gate element 208a and/or the second gate element 208b may correspond substantially to the gate element 208. For example, the first gate element 208a may include a first gate isolation 204a, a first memory element 205a, and a first gate electrode 206a. The first memory element 205a may be disposed between the first gate isolation 204a and the first gate electrode 206a. The memory cell 102 may include a first gate terminal 108a connected to the first gate electrode 206a. The read-out circuit 112 may be configured to carry out a first read-out operation to read out a memory state of the first memory element 205a. The first read-out operation may include: providing a first voltage at the first terminal 104 and a first gate voltage, $V_{G1}$, at the first gate terminal 108a such that the field-effect transistor structure is in a high-resistivity state and such that a first leakage current, $I_1$, through the first terminal 104 is generated; and sensing the first leakage current, $I_1$, to determine the memory state of the first memory element 205a. The second gate element 208*b* may include a second gate isolation 204*b*, a second memory element 205*b*, and a second gate electrode 206*b*. The second memory element 205*b* may be disposed between the second gate isolation 204*b* and the second gate electrode 206*b*. The memory cell 102 may include a second gate terminal 108*b* connected to the second gate electrode 206*b*. The read-out circuit 112 may be configured to carry out a second read-out operation to read out a memory state of the second memory element 205*b*. The second read-out operation may include: providing a second voltage at the second terminal 106 and a second gate voltage, $V_{G2}$, at the second gate terminal 108*b* such that the field-effect transistor structure is in a high-resistivity state and such that a second leakage current, $I_2$, through the second terminal 106 is generated; and sensing the second leakage current, $I_2$, to determine the memory state of the second memory element 208*b*. According to various aspects, the memory cell 102 may be configured to store a first memory state in the first memory element 205*a* and a second memory state in the second memory element 205*b*.

Figure 3A:
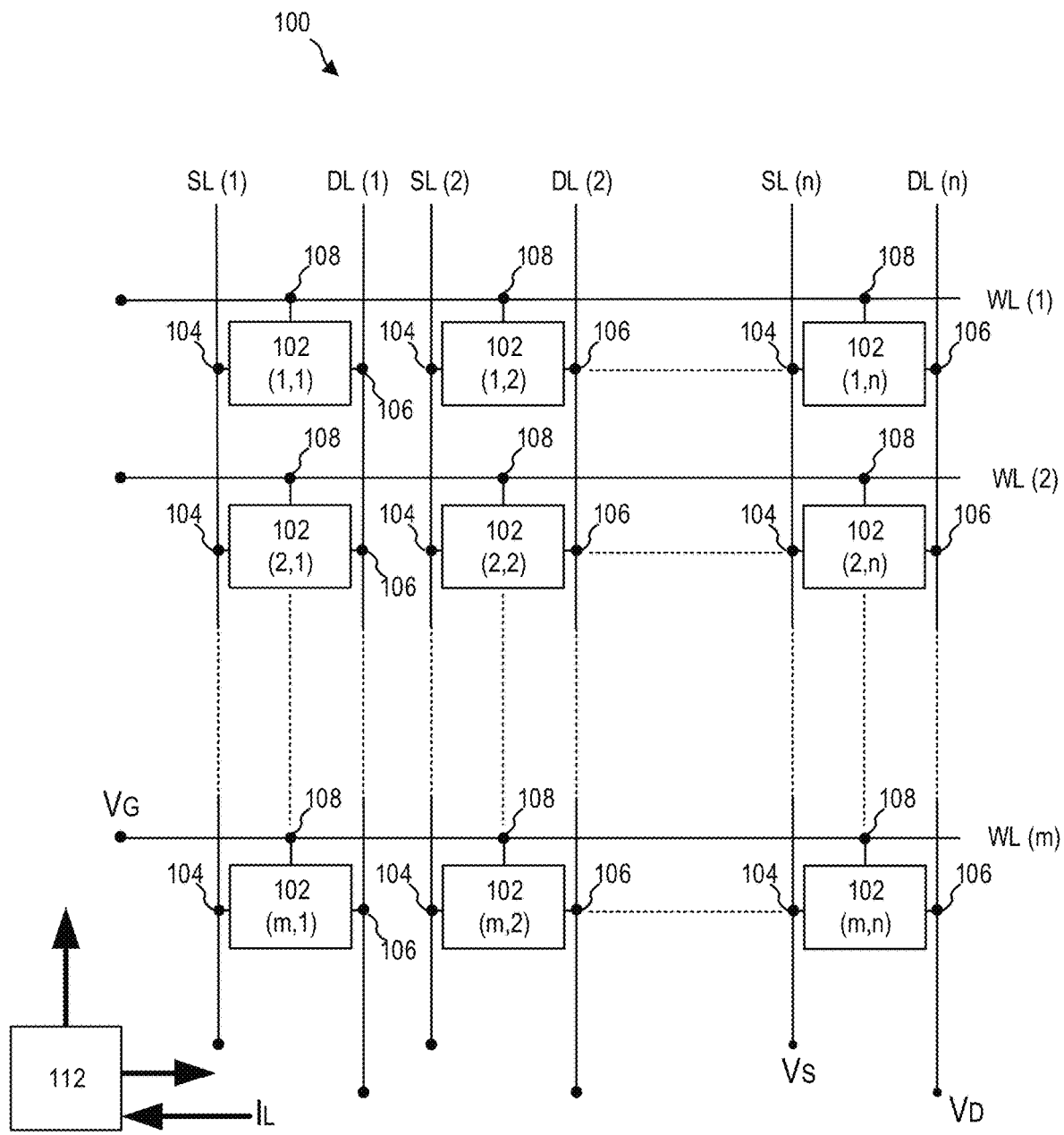
FIGS. 3A to 3C schematically show exemplary memory cell arrangements including a plurality of memory cells, according to various aspects.
Figure 3B:
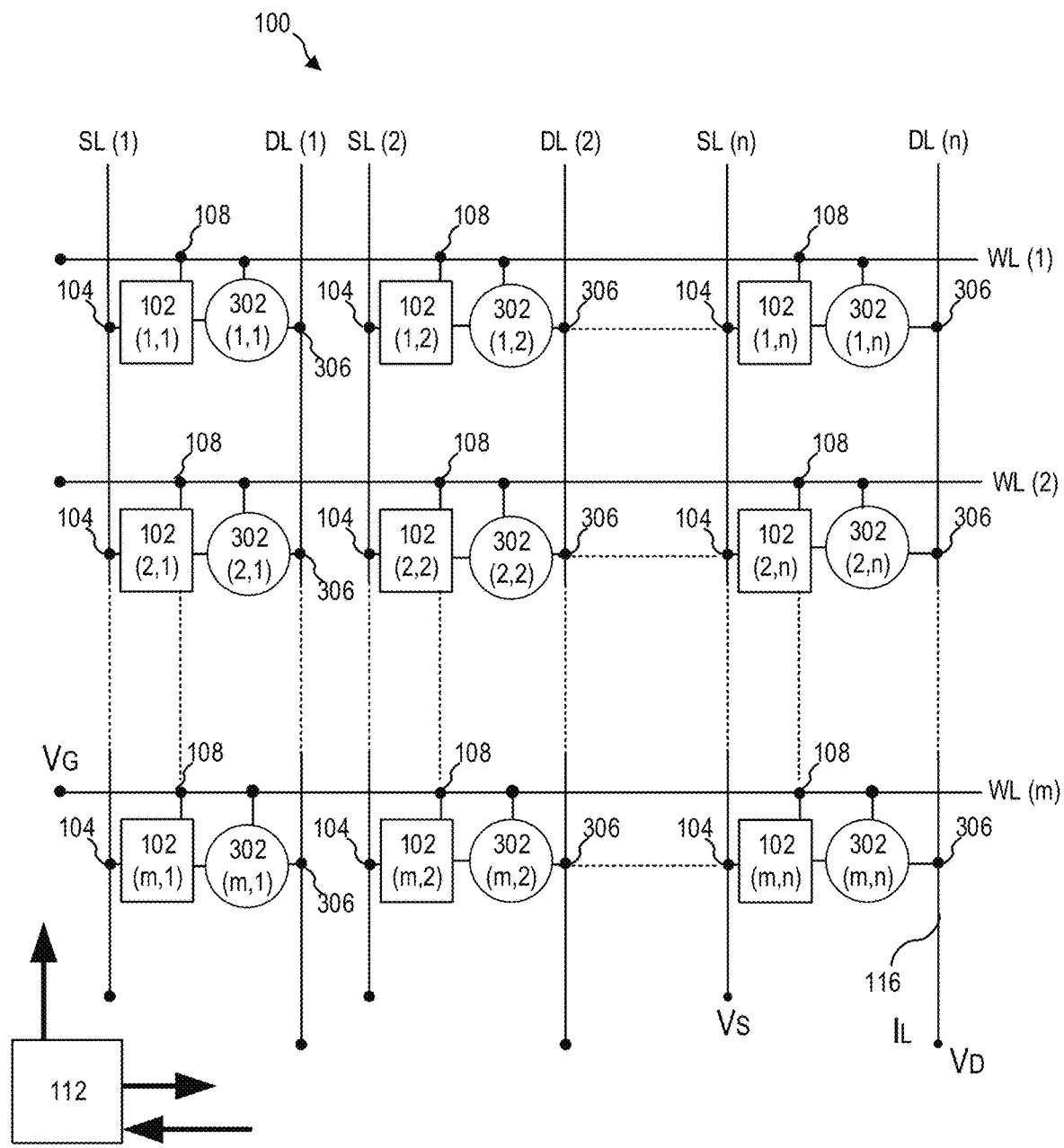
Figure 3C:
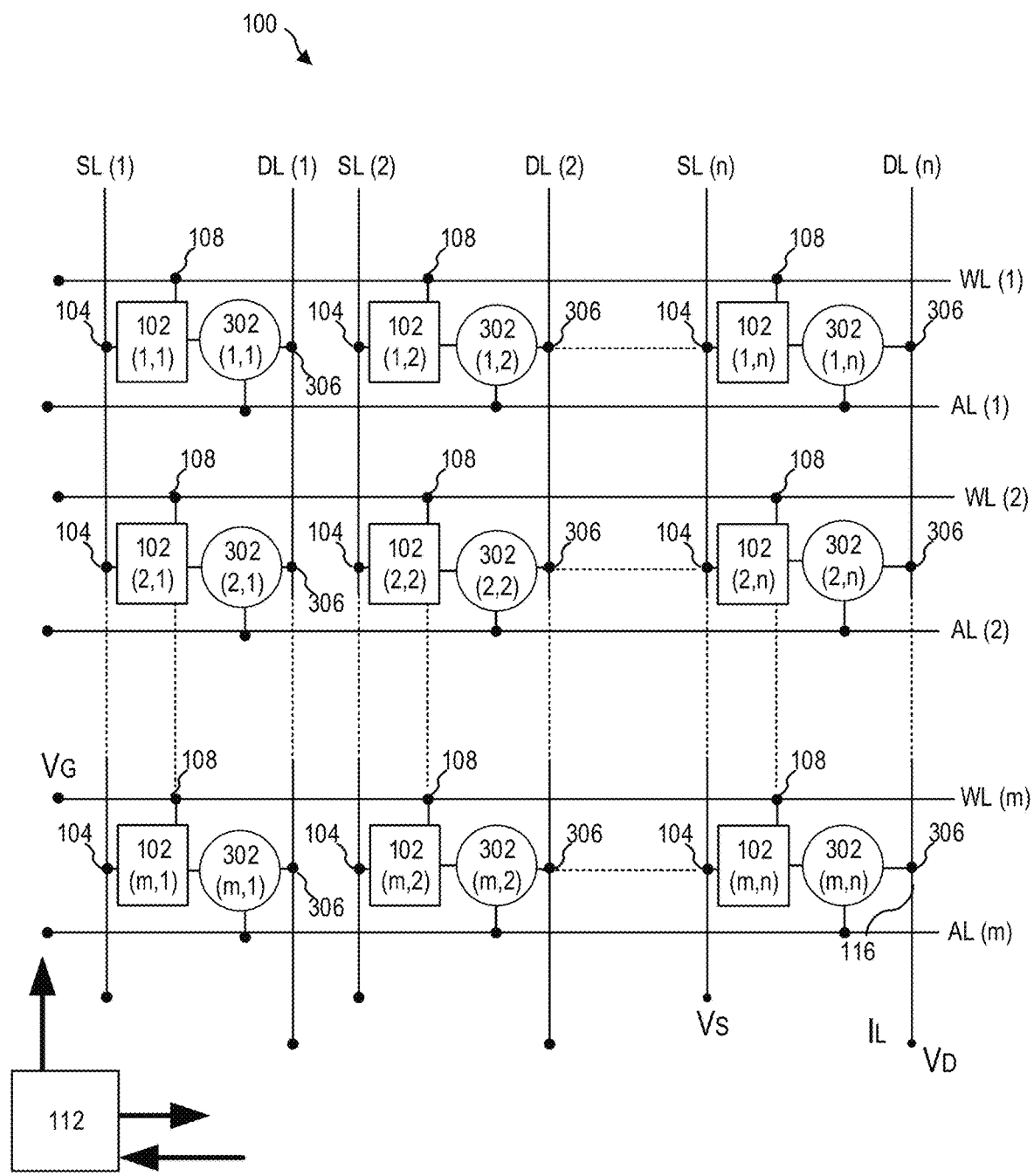

FIGS. 3A to 3C each schematically illustrate an exemplary memory cell arrangement 100 including a plurality of memory cells, according to various aspects. The memory cell arrangement 100 may include a plurality, n, of first control lines, for example, a plurality of sourcelines SL(n). The memory cell arrangement 100 may include a plurality, n, of second control lines, for example, a plurality of drainlines DL(n). The memory cell arrangement 100 may include a plurality, m, of third control lines, for example, a plurality of wordlines WL(m). Each memory cell of the plurality of memory cells the memory cell arrangement 100 may be configured as memory cell 102. For each memory cell 102(*m, n*) of the plurality of memory cells, the first terminal 104 may be connected to a corresponding sourceline SL(n), the second terminal 106 may be connected to a corresponding drainline DL(n), and the third terminal 108 may be connected to a corresponding wordline WL(m).

The readout-out circuit 112 may be configured to read out the memory state of at least one memory cell 102(*m, n*) of the plurality of memory cells 102 (e.g., by carrying out the read-out operation). For example, the readout-out circuit 110 may be configured to carry out the read-out operation including the following: providing the first voltage, $V_S$, at the first terminal 104, the second voltage, $V_D$, at the second terminal 106, and the third voltage, $V_G$, at the third terminal 108 such that the field-effect transistor structure 110 is in the high-resistivity state and that the leakage current, $I_L$, through the first terminal 104, and/or through the second terminal 106 is generated, and sensing the leakage current, $I_L$, to determine the memory state of the at least one memory cell 102(*m, n*)

With respect to FIG. 3B and FIG. 3C, the memory cell arrangement 100 may include a plurality of access devices (e.g., a transistor). The memory cell arrangement 100 may include a plurality of memory cells 102. According to various aspects, one or more access devices may be assigned to each memory cell of a plurality of memory cells 102. For example, the read-out circuit 112 may be configured to sense the leakage current, $I_L$, through the second terminal 106. A memory cell 102 may include an access device coupled to the second terminal 106 and to the drainline DL associated with the memory cell 102. The read-out circuit 112 may be configured to sense the leakage current, $I_L$, through the second terminal 106 at the drainline DL associated with the memory cell 102. For example, the read-out circuit 112 may be configured to sense the leakage current, $I_L$, through the first terminal 104. A memory cell 102 may include an access device coupled to the first terminal 104 and to the sourceline SL associated with the memory cell 102. The read-out circuit 112 may be configured to sense the leakage current, $I_L$, through the first terminal 104 at the sourceline SL associated with the memory cell 102. For example, the read-out circuit 112 may be configured to sense the leakage current, $I_L$, through the first terminal 104 and/or through the second terminal 106. A memory cell 102 may include a first access device and a second access device. The first access device may be coupled to the first terminal 104 and to the sourceline SL associated with the memory cell 102. The second access device may be coupled to the second terminal 106 and to the drainline DL associated with the memory cell 102. The read-out circuit 112 may be configured to sense the first leakage current, $I_1$, through the first terminal 104 at the sourceline SL associated with the memory cell 102 and/or the second leakage current, $I_2$, through the second terminal 106 at the drainline DL associated with the memory cell 102.

Each access device 302(*m, n*) of the plurality of access devices may be unambiguously (e.g., bijectively) assigned to a memory cell 102(*m, n*) of the plurality of memory cells. With respect to the exemplary configurations shown in FIG. 3B and FIG. 3C, For example, the read-out circuit 112 may be configured to sense the leakage current, $I_L$, through the second terminal 106. The read-out circuit 112 may be configured to sense the leakage current, $I_L$, at the drainline DL(n) associated with the memory cell 102(*m, n*) to be read out (e.g., the drainline DL(n) may be configured as control line 116). Each access device 302(*m, n*) of the plurality of access devices may be arranged between the corresponding second terminal 106 of the memory cell 102(*m, n*) and the corresponding drainline DL(n). For example, each access device 302(*m, n*) of the plurality of access devices may be connected to the second terminal 106 of the memory cell 102(*m, n*) and may be connected to the corresponding drainline DL(n). Each access device 302(*m, n*) of the plurality of access devices may be connected to the corresponding drainline DL(n) via a respective access terminal 306. Each access device 302(*m, n*) of the plurality of access devices may be configured to control (e.g., allow or prevent) an electrically conductive connection between the second terminal 106 of the memory cell 102(*m, n*) and the corresponding drainline DL(n).

According to various aspects, each access device 302(*m, n*) of the plurality of access devices may be configured to control (e.g., allow or prevent) an electrically conductive connection between the second terminal 106 of the memory cell 102(*m, n*) and the corresponding drainline DL(n) depending on a voltage (e.g., the third voltage, $V_G$) applied at the corresponding wordline WL(m) (see, for example, FIG. 3B). Each access device 302(*m, n*) of the plurality of access devices may be configured to allow an electrically conductive connection between the second terminal 106 of the memory cell 102(*m, n*) and the corresponding drainline DL(n) in the case that an absolute value of the third voltage, $V_G$, applied at the corresponding wordline WL(m) is greater than an access device threshold voltage. The absolute value of the access device threshold voltage may be less than the third voltage, $V_G$, applied at the corresponding wordline WL(m) in the case the read-out operation of the memory cell 102(*m, n*) is carried out.

According to various aspects, the memory cell arrangement 100 may include a plurality of access lines AL(m) (see, for example, FIG. 3C). Each access device 302(*m, n*) of the plurality of access devices may be configured to control (e.g., allow or prevent) an electrically conductive connection between the second terminal 106 of the memory cell 102(*m,* n) and the corresponding drainline DL(n) depending on a voltage applied at the corresponding access line AL(m). Each access device 302(m, n) of the plurality of access devices may be configured to allow an electrically conductive connection between the second terminal 106 of the memory cell 102(m, n) and the corresponding drainline DL(n) in the case that an absolute value of the voltage applied at the corresponding access line AL(m) is greater than the access device threshold voltage. The read-out operation may include providing the voltage at the access line AL(m) corresponding to the at least one memory cell 102(m, n) to be read out such that the associated access device 302(m, n) allows an electrically conductive connection between the second terminal 106 of the memory cell 102(m, n) and the corresponding drainline DL(n).

According to various aspects, one or more other memory cells of the plurality of memory cells are not to be read out. The access devices of the plurality of access devices associated with the one or more other memory cells not to be read out may be controlled such that an electrically conductive connection between the second terminal 106 of the respective memory cell 102(m, n) and the respective drainline DL(n) is prevented (e.g., by applying an inhibit voltage at the associated control lines (in the case of a configuration such as shown in FIG. 3B) and/or at the associated access lines (in the case of a configuration such as shown in FIG. 3C).

It is noted that the memory cell arrangement 100 shown in FIGS. 3A to 3C only provide examples for a memory cell arrangement 100 including a plurality of memory cells. According to various aspects, various further configurations are possible to read out a memory state of a memory cell 102 by sensing the leakage current, $I_L$ (e.g., by carrying out the read-out operation as described herein).

Figure 4A:
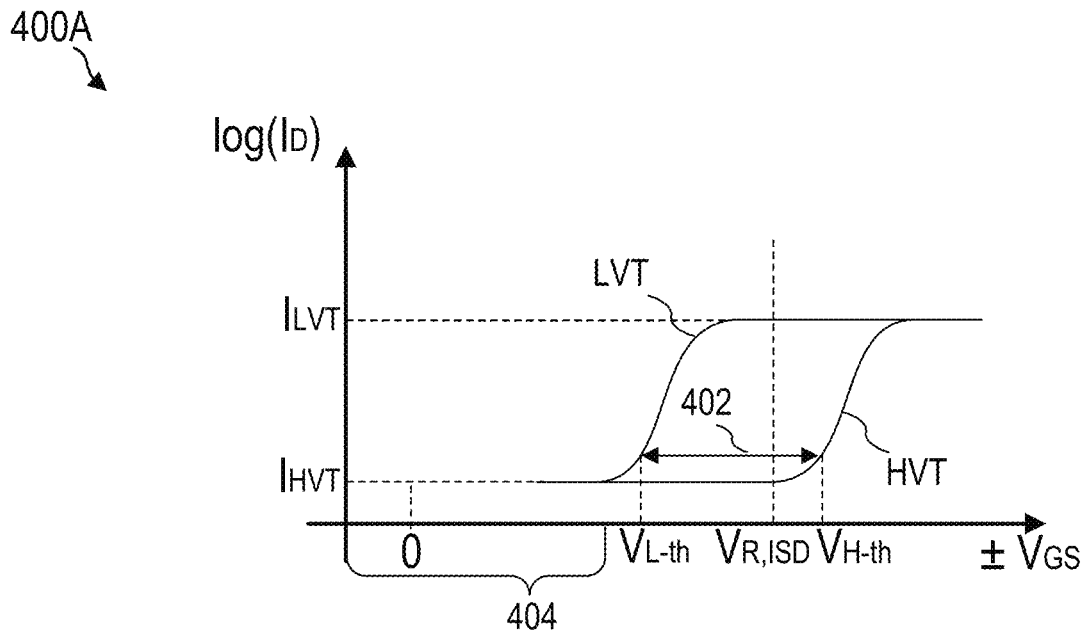
FIGS. 4A to 4D show each a current/voltage characteristic of a memory cell, according to various aspects.

FIG. 4A illustrates a current/voltage characteristic 400A of a remanently polarizable memory cell, such as a memory cell 102, according to various aspects. The current/voltage characteristic 400A exemplarily shows a current, $I_D$, through the second terminal 106 of the memory cell 102 as a function of the gate-source voltage, $V_{GS}$. It is noted that the leakage current may also be sensed as a leakage current through one or more other terminals, such as the first terminal 104, the third terminal 108, and/or the fourth terminal 118. The gate-source voltage, $V_{GS}$ may, for example in the case that the field-effect transistor structure 110 is or includes an n-type field-effect transistor structure, include positive voltage values and voltage values of the gate-source voltage, $V_{GS}$, below 0 V may correspond to negative voltage values. The gate-source voltage, $V_{GS}$ may, for example in the case that the field-effect transistor structure 110 is or includes a p-type field-effect transistor structure, include negative voltage values and voltage values of the gate-source voltage, $V_{GS}$, below 0 V may correspond to positive voltage values.

The memory cell 102 may include the low threshold voltage, $V_{L-th}$, associated with the first memory state of the memory cell 102 and the high threshold voltage, $V_{H-th}$, associated with the second memory state of the memory cell 102. As described above, the drift current, $I_{SD}$, may flow from the first terminal 104 to the second terminal 106 for a voltage value of the gate-source voltage, $V_{GS}$, greater than the low threshold voltage, $V_{L-th}$, in the case that the field-effect transistor structure 110 is in the LVT state and the drift current, $I_{SD}$, may flow from the first terminal 104 to the second terminal 106 for a voltage value of the gate-source voltage, $V_{GS}$, greater than the high threshold voltage, $V_{H-th}$, in the case that the field-effect transistor structure 110 is in the HVT state (see, for example FIG. 4B). The low threshold voltage, $V_{L-th}$, and the high threshold voltage, $V_{H-th}$, may define a voltage window 402. The memory cell 102 may be read out by applying the gate-source voltage, $V_{GS}$, having a drift-current read voltage value, $V_{R,ISD}$, within the voltage window 402. The memory state of the memory cell 102 may be determined based on the drift current, $I_{SD}$, flowing from the first terminal 104 to the second terminal 106. The current, $I_D$, through the second terminal 106 may have a first current value, $I_{LVT}$, in the case that the memory cell is in the first memory state and may have a second current value, $I_{HVT}$, in the case that the memory cell is in the second memory state.

According to various aspects, for voltage values of the gate-source voltage, $V_{GS}$, within a high-resistivity voltage range 404 below the low threshold voltage, $V_{L-th}$, the field-effect transistor structure 110 may be in the high-resistivity state for both, the LVT state and the HVT state.

Figure 4B:
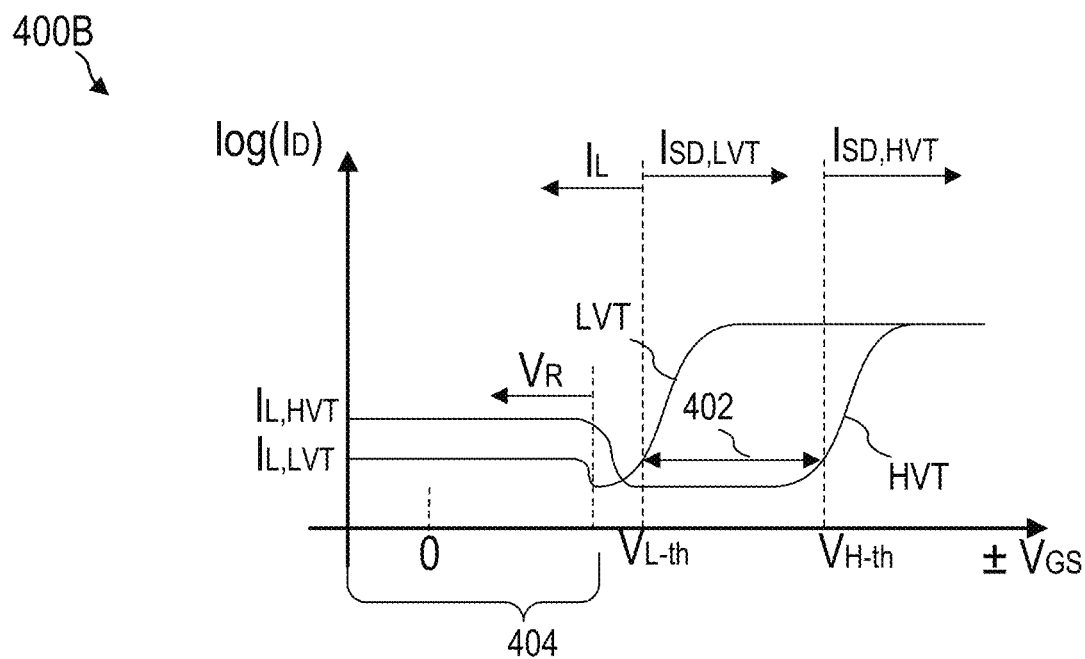
Figure 4C:
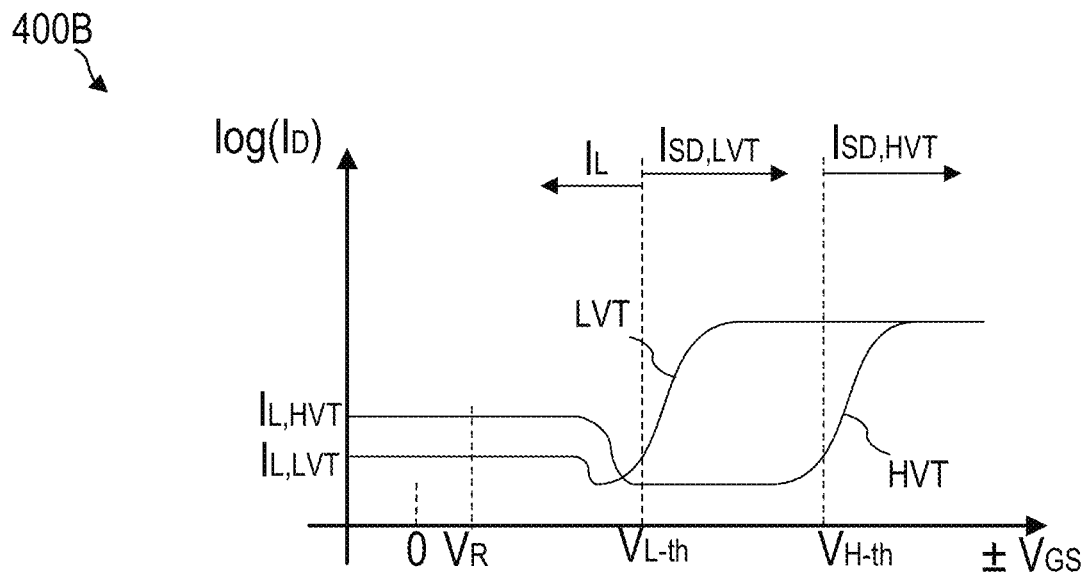

FIG. 4B and FIG. 4C each illustrate a current/voltage characteristic 400B of a memory cell 102, according to various aspects. The memory cell 102 may be configured such that the leakage current, $I_L$, is generated in the case that a gate-source voltage, $V_{GS}$, less than the low threshold voltage, $V_{L-th}$, is provided, as described above. The leakage current, $I_L$, may be a function of the memory state of the memory cell 102. For example, a first leakage current, $I_{L,LVT}$, may be generated in the case that the memory cell 102 is in the first memory state and a second leakage current, $I_{L,HVT}$, may be generated in the case that the memory cell 102 is in the second memory state. According to various aspects, an absolute current value of the first leakage current, $I_{L,LVT}$, and/or an absolute current value of the second leakage current, $I_{L,HVT}$, may be less than an absolute current value, $I_{LVT}$, associated with the LVT state of the field-effect transistor structure 110. According to various aspects, an absolute current value of the first leakage current, $I_{L,LVT}$, and/or an absolute current value of the second leakage current, $I_{L,HVT}$, may be less than an absolute current value, $I_{HVT}$, associated with the HVT state of the field-effect transistor structure 110. For example, an absolute current value of the leakage current, $I_L$ (e.g., $I_{L,LVT}$, and/or $I_{L,HVT}$) may be lower than an absolute voltage value of the drift current, $I_{SD}$.

According to various aspects, the voltage value of the first leakage current, $I_{L,LVT}$, and/or the voltage value of the second leakage current, $I_{L,HVT}$, may be shifted to more positive voltage values with increasing voltage values of the second voltage, $V_D$. According to various aspects, the voltage value of the first leakage current, $I_{L,LVT}$, and/or the voltage value of the second leakage current, $I_{L,HVT}$, may be shifted to lower voltage values with decreasing voltage values of the second voltage, $V_D$.

The read-out circuit 112 may be configured to read out the memory cell 102 by providing a gate-source voltage, $V_{GS}$, having a voltage value less than the low threshold voltage, $V_{L-th}$, of the memory cell 102. The read-out circuit 112 may be configured to read out the memory cell 102 by providing the gate-source voltage, $V_{GS}$, having a read voltage value, $V_R$, less than a voltage value of the low threshold voltage, $V_{L-th}$. According to various aspects, the read voltage value, $V_R$, may be selected within the high-resistivity voltage range 404. For example, the read voltage value, $V_R$, in the case of sensing the leakage current, $I_L$, may be less than the drift current read voltage value, $V_{R,ISD}$, in the case of sensing the drift current, $I_{SD}$. The lower read voltage value, $V_R$, in case of sensing the leakage current, $I_L$, may reduce the power consumption of a device including the memory cell arrangement 100. The lower read voltage value, $V_R$, in case of sensing the leakage current, $I_L$, may reduce the number of read disturbs occurring by carrying the read-out operation. The lower read voltage value, $V_R$, in case of sensing the leakage current, $I_L$, may reduce the amount of electron trapping by carrying the read-out operation. The lower read voltage value, $V_R$, in case of sensing the leakage current, $I_L$, may allow for a higher reading speed (e.g., a faster read-out operation).

According to various aspects, the read voltage value, $V_R$ (e.g., defined by a gate-source voltage, $V_{GS}$) provided to the memory cell 102 to read out the memory cell 102 (e.g., by carrying out the read-out operation) may have an absolute voltage value in a range from about 0 V to about 1 V (e.g., in a range from about 0 V to about 0.8 V, e.g., in a range from about 0 V to about 0.5 V, e.g., less than 0.5 V). According to various aspects, an absolute voltage value of the third voltage, $V_G$, provided to the third terminal 108 may be in a range from about 0 V to about 1.5 V (e.g., in a range from about 0 V to about 1 V, e.g., in a range from about 0 V to about 0.5 V, e.g., less than 0.5 V). According to various aspects, the read voltage value, $V_R$, is selected such that an absolute value of the drift current, $I_{SD}$, is less than 0.1 μA (e.g., less than 0.05 μA, e.g., less than 0.01 μA).

Figure 4D:
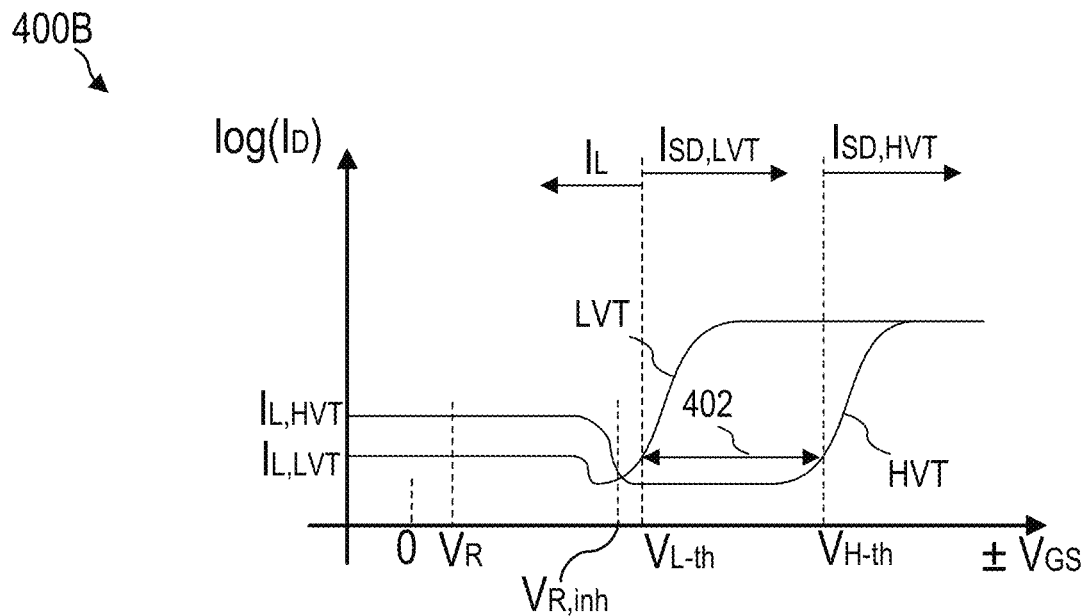

According to various aspects, the memory cell arrangement 100 may include a plurality of memory cells, as described, for example with respect to FIG. 3B. For example, a read-out circuit 112 may be configured to provide the gate-source voltage, $V_{GS}$, having a read-inhibit voltage value, $V_{R,inh}$, at one or more wordlines WL that are not associated with the memory cell 102(m, n) to be read out (e.g., at each wordline WL expect for the WL(m) corresponding to the memory cell 102(m, n) to be read out). With respect to FIG. 4D, the read-inhibit voltage value, $V_{R,inh}$, may be selected such that the drift current, $I_{SD}$, and/or the leakage current, $I_L$, are minimized.

Figure 4E:
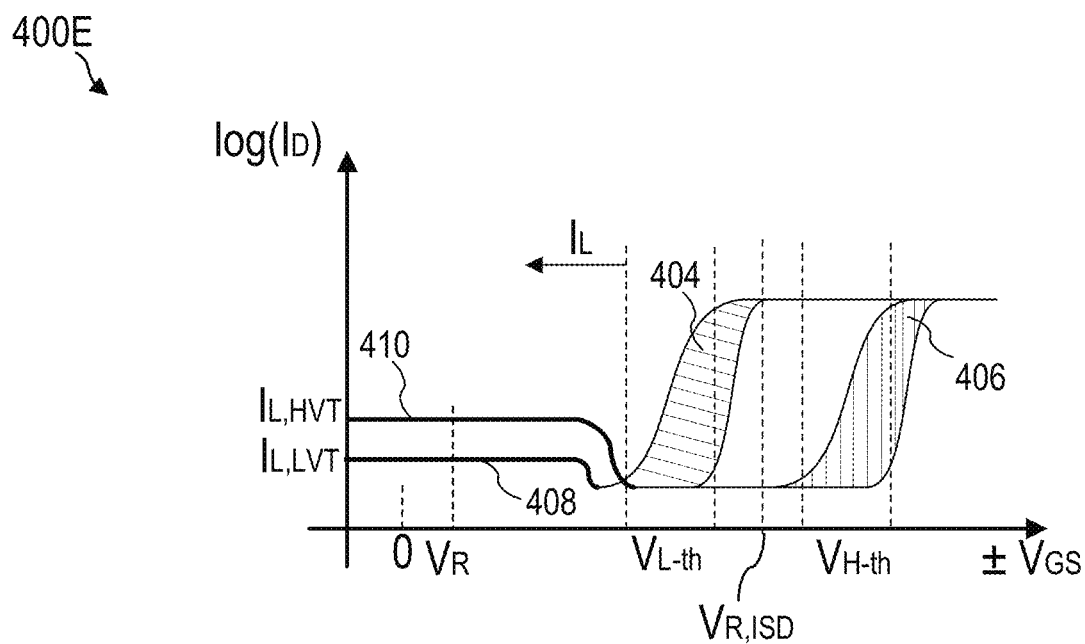
FIG. 4E shows a current/voltage characteristic distribution of a plurality of memory cells, according to various aspects.

FIG. 4E illustrates a current/voltage characteristic 400E of a plurality of memory cells, according to various aspects. One or more memory cells of the plurality of memory cells may have different current/voltage characteristics as compared to one or more other memory cells. Each memory cell 102 of the plurality of memory cells may be associated with a first drift current-voltage characteristic in the case that the memory cell 102 is in the first memory state (e.g., the LVT state). One or more of the first drift current-voltage characteristics may be at least partially different from other first drift current-voltage characteristics such that the first drift current-voltage characteristics of the plurality of memory cells provide a first drift current-voltage-distribution 404. Each memory cell 102 of the plurality of memory cells may be associated with a second drift current-voltage characteristic in the case that the memory cell 102 is in the second memory state (e.g., the HVT state). One or more of the second drift current-voltage characteristics may be at least partially different from other second drift current-voltage characteristics such that the second drift current-voltage characteristics of the plurality of memory cells provide a second drift current-voltage-distribution 406.

Figure 4F:
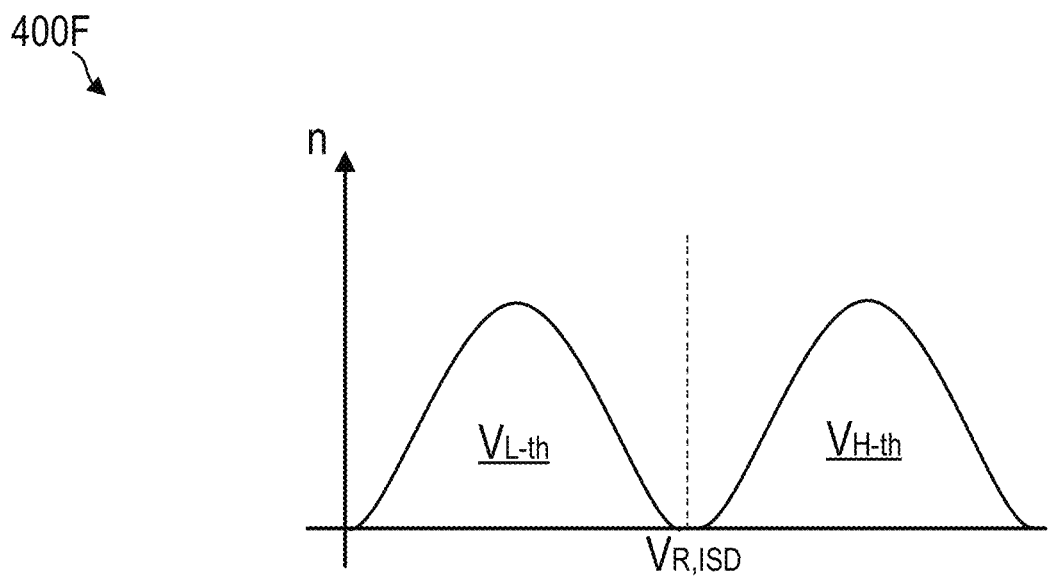
FIG. 4F shows a distribution of gate-source threshold voltages of a plurality of memory cells, according to various aspects.

According to various aspects, the first drift current-voltage-distribution 404 may include a range of low threshold voltages, $V_{L-th}$, associated with the plurality of memory cells. The second drift current-voltage-distribution 406 may include a range of high threshold voltages, $V_{H-th}$, associated with the plurality of memory cells. A distribution 400F of the low threshold voltages, $V_{L-th}$, and the high threshold voltages, $V_{H-th}$, is shown in FIG. 4F.

As described above, the memory cell 102 may be read out by using the drift current, $I_{SD}$. The range within which the drift current read voltage value, $V_{R,ISD}$, may be selected (e.g., between the first drift current-voltage-distribution 404 and the second drift current-voltage-distribution 406) may narrow with broadening drift current-voltage-distributions.

According to various aspects, the plurality of memory cells may have a first leakage current-voltage-distribution 408 in the case that the memory cell 102 is in the LVT state and may have a second leakage current-voltage-distribution 410 in the case that the memory cell 102 is in the HVT state. According to various aspects, the range within which the read voltage value, $V_R$, may be selected may be substantially independent of the leakage current-voltage-distributions.

Figure 4G:
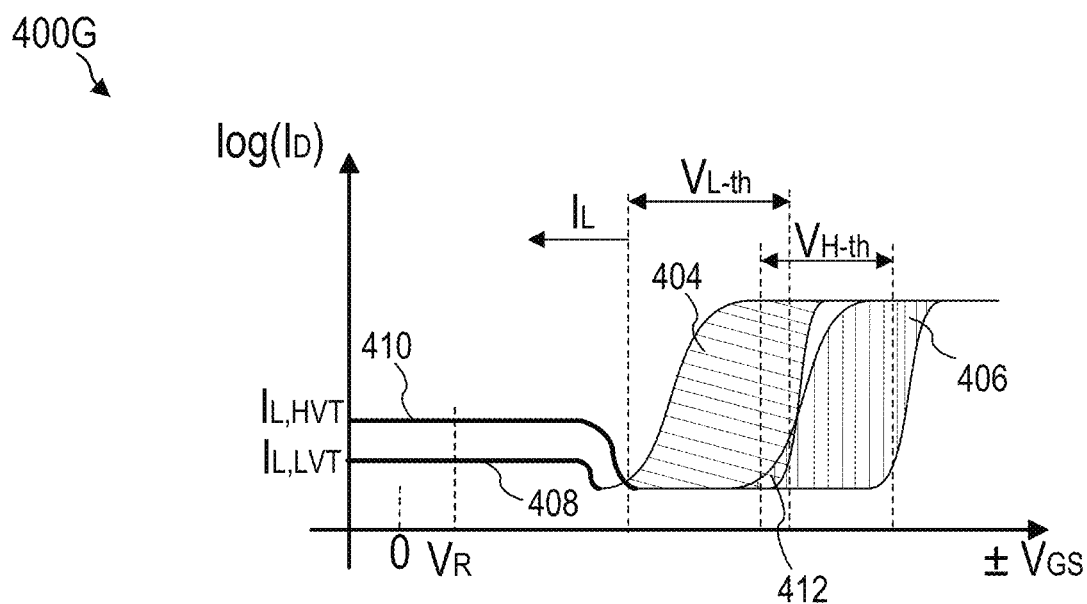
FIG. 4G shows a current/voltage characteristic distribution of a plurality of memory cells, according to various aspects.
Figure 4H:
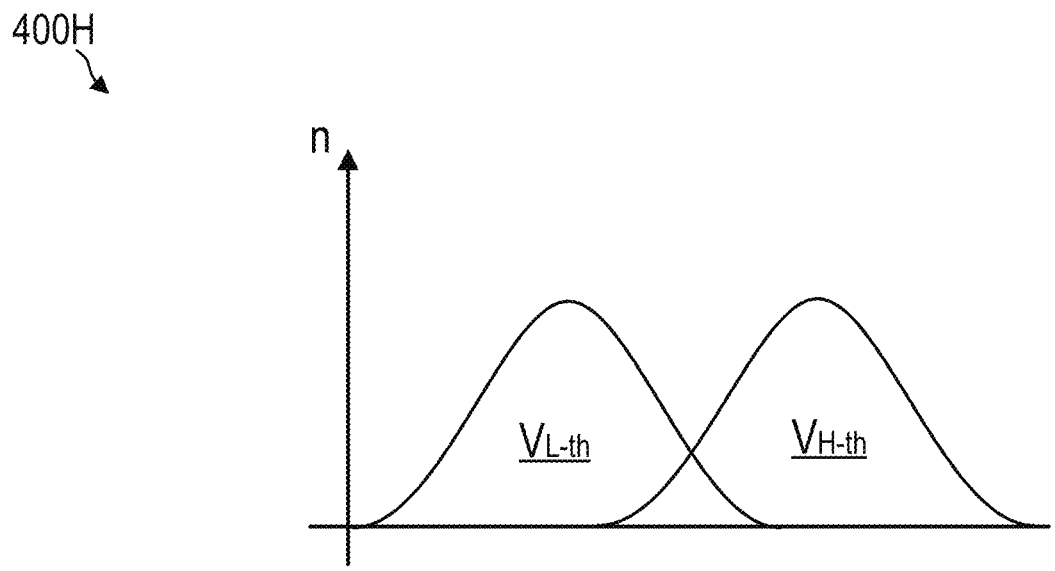
FIG. 4H shows a distribution of gate-source threshold voltages of a plurality of memory cells, according to various aspects.

FIG. 4G illustrates a current/voltage characteristic 400G of a plurality of memory cells, according to various aspects, wherein first drift current-voltage distribution 404 and/or the second drift current-voltage distribution 406 are broadened such that the first drift current-voltage distribution 404 and the second drift current-voltage distribution 406 at least partially overlap (see overlapping region 412). A distribution 400H of the low threshold voltages, $V_{L-th}$, and the high threshold voltages, $V_{H-th}$, is shown in FIG. 4H. In consequence, there may be no range for selecting the drift current read voltage value, $V_{R,ISD}$ (e.g., no distinguished separation between the LVT state and the HVT state). However, the first leakage current-voltage-distribution 408 and/or the second leakage current-voltage-distribution 410 may be substantially independent of the broadening of the first drift current-voltage distribution 404 and/or the second drift current-voltage distribution 406. Therefore, sensing the leakage current, $I_L$, may allow for a better variability with respect to the read voltage value, $V_R$. According to various aspects, the read voltage voltage, $V_R$ (e.g., defined by a gate-source voltage, $V_{GS}$) may be provide such that the field-effect transistor structure 110 is in the high-resistivity state (e.g., such that substantially no drift current $I_{SD}$, is flowing from the first terminal 104 to the second terminal 106) and such that the leakage current, $I_L$, is generated.

The first drift current-voltage distribution 404 and/or the second drift current-voltage distribution 406 may broaden, for example, due to reduced memory cell dimensions (e.g., lateral memory cell dimensions). According to various aspects, each memory cell 102 of the plurality of memory cells may have a at least one respective lateral dimension (e.g., a lateral dimension of the gate structure 108g, e.g., a lateral dimension of the channel region 114) such that the first drift current-voltage distribution 404 and the second drift current-voltage distribution 406 at least partially overlap. The at least one lateral dimension of one or more of the memory cells be less than 500 nm (e.g., less than 400 nm, e.g., less than 300 nm, e.g., less than 240 nm, e.g., less than 200 nm, e.g., less than 100 nm, e.g., less than 50 nm). Sensing the leakage current, $I_L$, may allow for smaller dimensions of the memory cell 102 (e.g., the field-effect transistor structure 110) as compared to sensing the drift current, $I_{SD}$. According to various aspects, the structure 108g of the field-effect transistor structure 110 may have a footprint such that the first drift current-voltage distribution 404 and the second drift current-voltage distribution 406 at least partially overlap. For example, the footprint may be less than 0.1 μm$^2$, e.g., less than 0.05 μm$^2$.

Figure 4I:
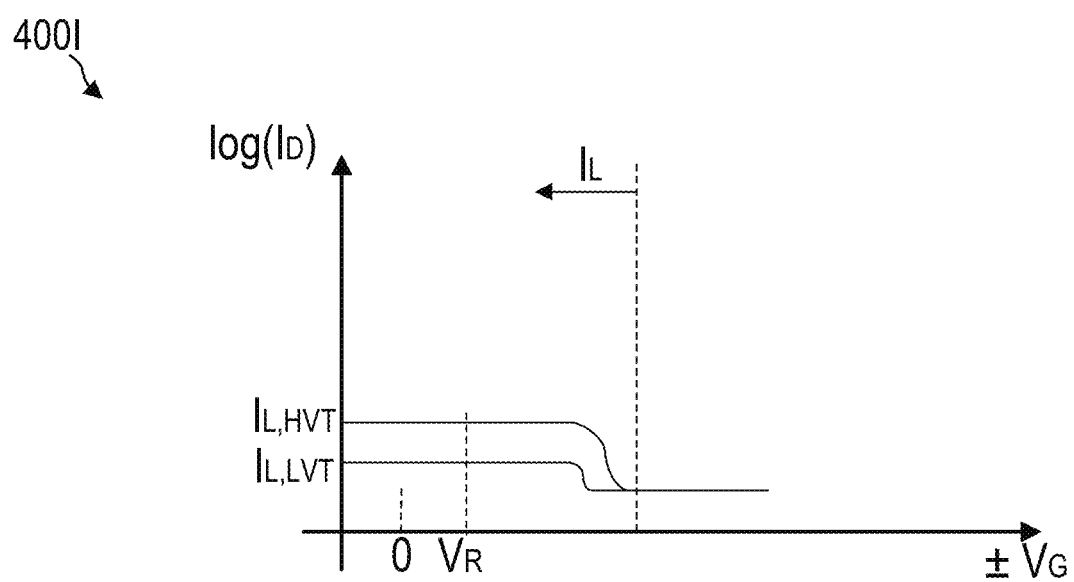
FIG. 4I shows a current/voltage characteristic of a memory cell, according to various aspects.

FIG. 4I illustrates a current/voltage characteristic 400I of a memory cell 102, according to various aspects. According to various aspects, the memory cell 102 may be configured such that substantially no drift current, $I_{SD}$, (e.g., such that no memory state dependent drift current) occurs. For example, the field-effect transistor structure 110 may include a channel portion. The channel portion may be connected to the first source/drain region of the field-effect transistor structure 110 and/or to the second source/drain region of the field-effect transistor structure 110. For example, the channel portion may be connected to either the first source/drain region or the second source/drain region. In the case that the channel portion is connected to the first source/drain region and the second source/drain region of the field-effect transistor structure 110, the channel region 114 may be or may include the channel portion.

According to various aspects, the memory cell 102 may include two terminals, e.g., the second terminal 106 and the third terminal 108. For example, the read-out operation may include providing the second voltage, $V_D$, at the second terminal 106 and the third voltage, $V_G$, at the third terminal 108 such that substantially no drift current flows from, to and/or through one of the terminals (e.g., the second terminal 106 and/or the third terminal 108) and such that the leakage current, $I_L$, is generated.

It is noted that, even though the FIGS. 4A to 4G are described with respect to the current, $I_D$, through the second terminal 106 as a function of the gate-source voltage, $V_{GS}$, the figures as well as the corresponding description may apply analogously for the current, $I_D$, through the second terminal 106 as a function of the third voltage, $V_G$, or of the gate-drain voltage, $V_GD$, as well as for a current, Is, through the first terminal 104 as a function of the third voltage, $V_G$, of the gate-source voltage, $V_{GS}$, or of the gate-drain voltage, $V_{GD}$.

Figure 5A:
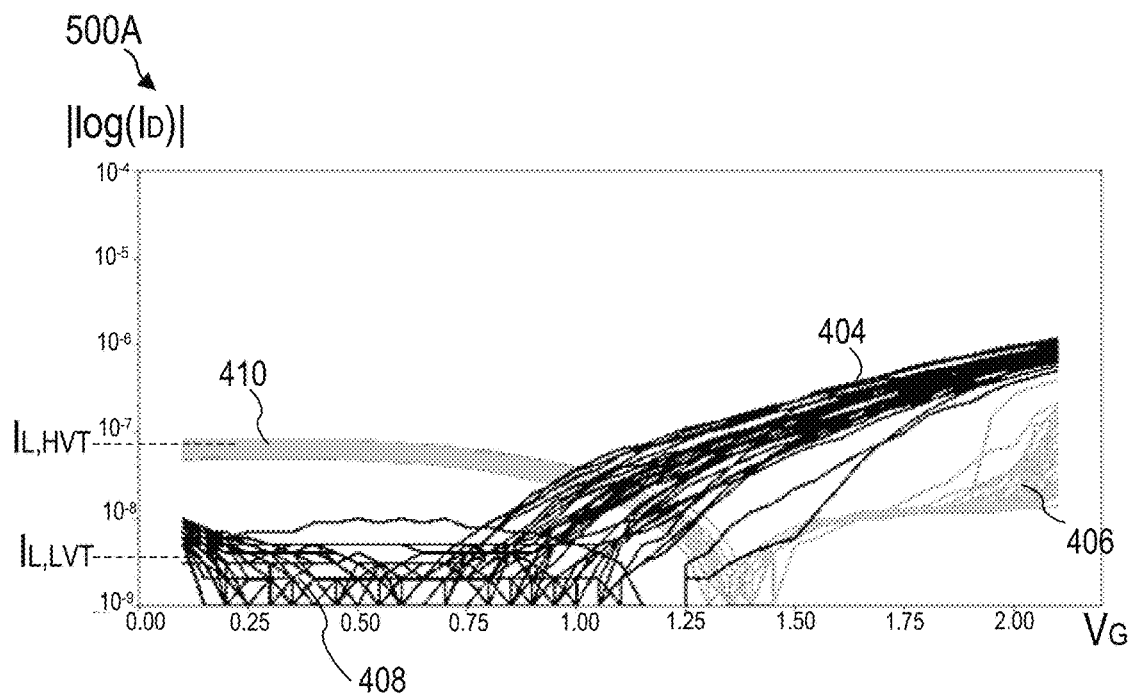
FIGS. 5A to 5C show each a measured current/voltage characteristic distribution of a plurality of memory cells, according to various aspects.
Figure 5B:
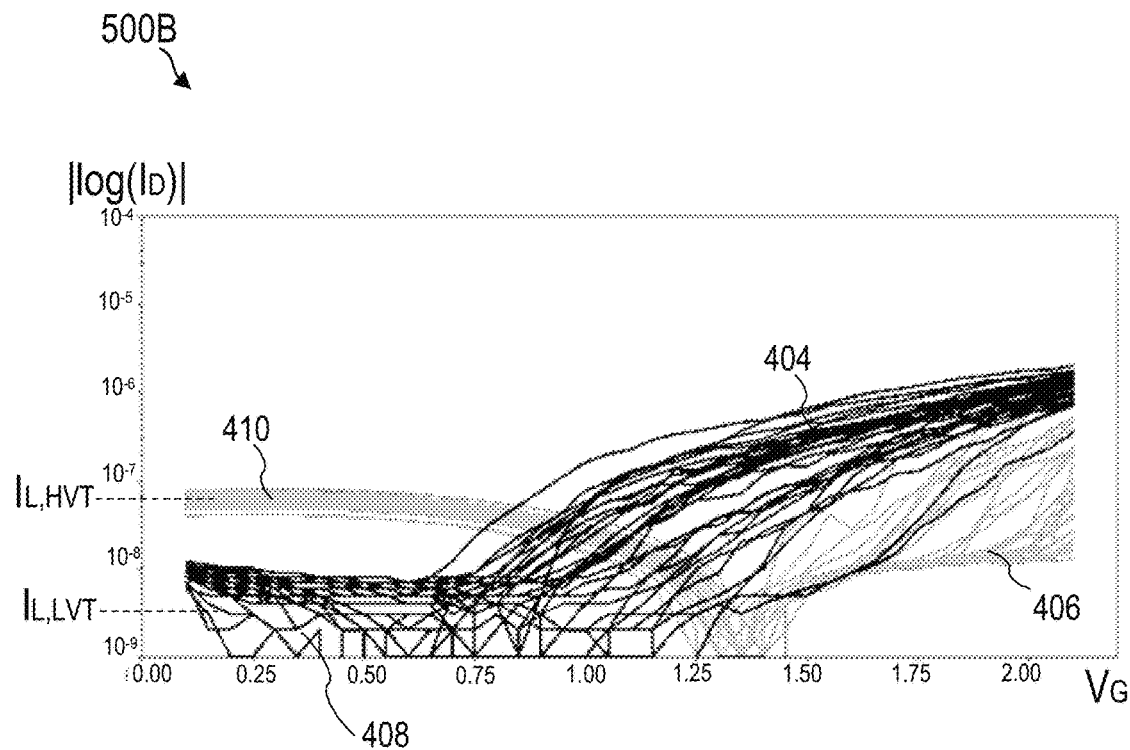
Figure 5C:
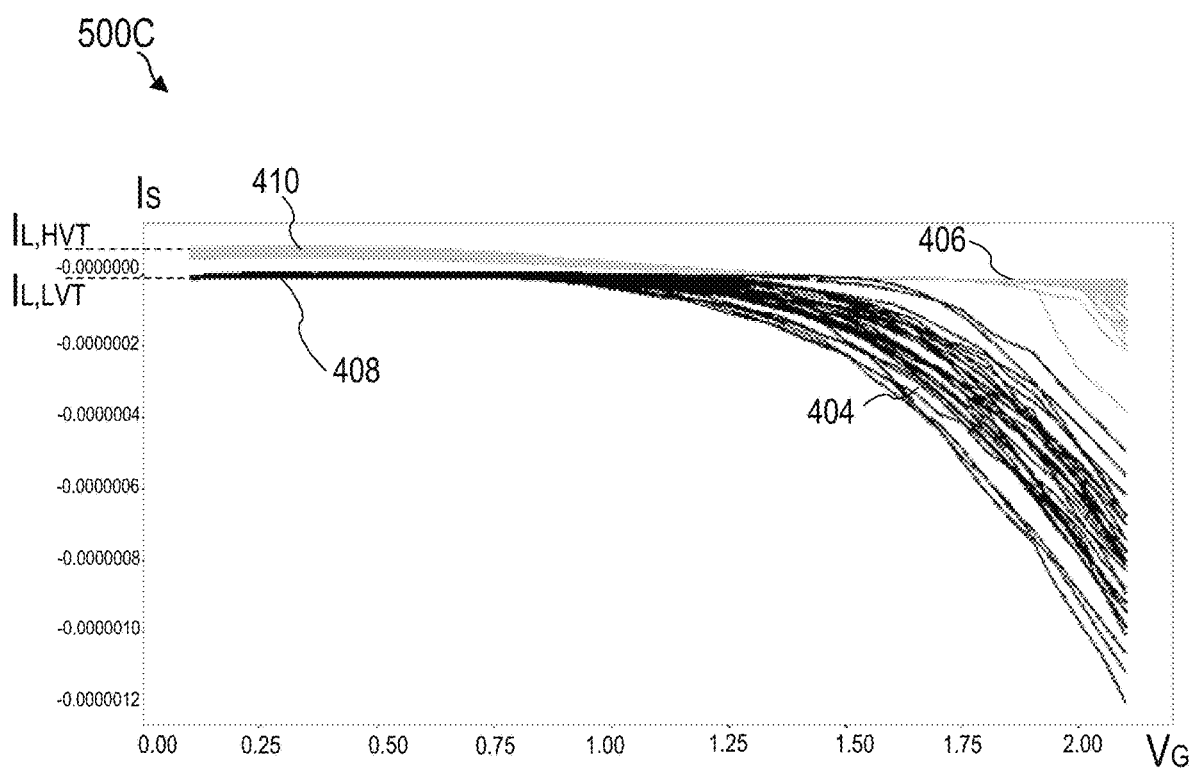

FIGS. 5A to 5C illustrate each a respective measured current/voltage distribution of a plurality of memory cells, according to various aspects. The respective current/voltage distributions are measured by applying the first voltage, $V_S$, having a voltage value of about 0.4 V and the second voltage, $V_D$, having a voltage value of about 1 V.

A measured current/voltage distribution 500A illustrated in FIG. 5A shows the absolute value of the logarithm of the current, $I_D$, through the second terminal 106 as a function of the third voltage, $V_G$. Each memory cell 102 of the measured plurality of memory cells has a first lateral dimension of about 500 nm and a second lateral dimension of about 500 nm. The first leakage current voltage distribution 408 and the second leakage current voltage distribution 410 are clearly separated from one another, as seen in FIG. 5A.

FIG. 5B illustrates a measured current/voltage distribution 500B, wherein each memory cell 102 of the measured plurality of memory cells has a first lateral dimension of about 200 nm and a second lateral dimension of about 200 nm. Here, the first drift current-voltage distribution 404 and the second drift current-voltage distribution 406 overlap at least partially. However, the first leakage current voltage distribution 408 and the second leakage current voltage distribution 410 are clearly separated from one another.

FIG. 5C illustrates a measured current/voltage distribution 500C showing a current, $I_S$, through the first terminal 104 as a function of the third voltage, $V_G$. According to various aspects, the current value of the leakage current, $I_{L,HVT}$, in the case that the field-effect transistor structure 110 is in the HVT state may have a positive voltage value the current value of the leakage current, $I_{L,LVT}$, in the case that the field-effect transistor structure 110 is in the LVT state may have a negative voltage value, or vice versa. For example, the leakage current, $I_{L,HVT}$, in the case that the field-effect transistor structure 110 is in the HVT state may have a positive voltage value the current value of the leakage current, $I_{L,LVT}$, in the case that the field-effect transistor structure 110 is in the LVT state may be of opposite sign.

According to various aspects, in the case that the field-effect transistor structure 110 is in the low-resistivity state, the drift current, $I_{SD}$, may flow from the first terminal 104 to the second terminal 106. This may be associated with a negative current through the first terminal 104. According to various aspects, in the case that the field-effect transistor structure 110 is in the high-resistivity state, no substantial drift current, $I_{SD}$, may flow from the first terminal 104 to the second terminal 106 and a leakage current, $I_L$, may flow through the first terminal 104. For example, the leakage current, $I_L$, may be a GISL flowing from the bulk region of the field-effect transistor structure 110 to the first source/drain region 104s of the field-effect transistor structure 110. This may be associated with a positive current through the first terminal 104.

FIG. 6 shows a schematic flow diagram of a method 600, e.g., a method for reading a memory cell, according to various aspects. The memory cell to be read out may include a field-effect transistor structure.

According to various aspects, the method 600 may include applying a first voltage at a first terminal of the memory cell, a second voltage at a second terminal of the memory cell, and a third voltage at a third terminal of the memory cell such that the field-effect transistor structure is in a high-resistivity state and that a leakage current through the first terminal and/through the second terminal is generated (in 602).

According to various aspects, the high-resistivity state of the field-effect transistor structure may be associated with substantially no drift current, $I_{SD}$, flowing from the first terminal to the second terminal. According to various aspects, the first voltage and the third voltage may be selected such that an absolute value of a voltage difference between the third voltage and the first voltage may be less than a threshold voltage associated with the field-effect transistor structure (e.g., associated with a memory state of the memory cell).

The method 600 may further include sensing the leakage current to determine the memory state of the memory cell (in 604).

In the following, various examples are provided that may include one or more aspects described above with reference to the memory cell arrangement 100 and the method 600. It may be intended that aspects described in relation to the memory arrangement 100 may apply also to the method 600, and vice versa.

Example 1 is a memory cell arrangement including at least one memory cell, the at least one memory cell including a first terminal, a second terminal, a third terminal, and a field-effect transistor structure including a first source/drain region connected to the first terminal, a second source/drain region connected to the second terminal, and a gate structure connected to the third terminal. The gate structure may include a memory element. The memory cell arrangement may further include a read-out circuit configured to carry out a read-out operation to read out a memory state of the memory element, the read-out operation including: providing a first voltage at the first terminal, a second voltage at the second terminal, and a third voltage at the third terminal such that the field-effect transistor structure is in a high-resistivity state and such that a leakage current through the first terminal and/or through the second terminal is generated; and sensing the leakage current to determine the memory state of the memory element.

In Example 2, the subject matter of Example 1 may optionally include that no substantial drift current occurs between the first terminal and the second terminal in the case that the field-effect transistor structure is in the high-resistivity state.

In Example 3, the subject matter of Example 1 or 2 may optionally include that the channel region is non-conductive in the case that the field-effect transistor structure is in the high-resistivity state.

In Example 4, the subject matter of any one of Examples 1 to 3 may optionally include that an absolute value of a voltage difference between the first voltage and the third voltage is in a range from about 0 V to about 1 V (e.g., less than 0.5 V).

In Example 5, the subject matter of any one of Examples 1 to 4 may optionally include that an absolute value of the third voltage is in a range from about 0 V to about 1.5 V (e.g., less than 1 V, e.g., less than 0.5 V).

Example 6 is a memory cell arrangement including at least one memory cell, the at least one memory cell including a field-effect transistor structure including a source region, a drain region, and a gate region, a memory element. The field-effect transistor structure and the memory element are configured such that a first gate-source threshold voltage is associated with the field-effect transistor structure in the case that the memory element is in a first memory state and that a second gate-source threshold voltage is associated with the field-effect transistor structure in the case that the memory element is in a second memory state. The memory cell arrangement may further include a read-out circuit configured to carry out a read-out operation to read out the memory state of the memory element, the read-out operation including: providing a gate-source voltage across the gate region and the source region, wherein a voltage value of the gate-source voltage is more negative than a voltage value of both the first gate-source threshold voltage and the second gate-source threshold voltage in the case that the field-effect transistor structure is an n-type field-effect transistor structure, and wherein a voltage value of the gate-source voltage is more positive than a voltage value of both the first gate-source threshold voltage and the second gate-source threshold voltage in the case that the field-effect transistor structure is a p-type field-effect transistor structure; providing a drain voltage at the drain region of the field-effect transistor structure such that a leakage current is generated; sensing the leakage current to determine the memory state of the memory element.

In Example 7, the subject matter of Example 6 may optionally include that gate-source voltage is in a range from about 0 V to about 1 V (e.g., less than 0.5 V).

In Example 8, the subject matter of Example 6 or 7 may optionally include that the first gate-source threshold voltage and the second gate-source threshold voltage are defined by a reference source-drain current and the leakage current is less than the reference source-drain current.

Example 9 is a memory cell arrangement including at least one memory cell, the at least one memory cell including a field-effect transistor structure and a memory element. The field-effect transistor structure and the memory element are configured such that, in the case that the memory element is in a first memory state, the field-effect transistor structure is in a high-resistivity state in the case that a control voltage is provided that is less than a first threshold voltage and such that the field-effect transistor structure is in a low-resistivity state in the case that a control voltage is provided that is greater than the first threshold voltage, and the field-effect transistor structure and the memory element are further configured such that, in the case that the memory element is in a second memory state, the field-effect transistor structure is in the high-resistivity state in the case that a control voltage is applied that is less than a second threshold voltage and such that the field-effect transistor structure is in the low-resistivity state in the case that a control voltage is applied that is greater than the second threshold voltage. The memory cell arrangement may further include a read-out circuit configured to carry out a read-out operation to read out the memory state of the memory element, the read-out operation including providing a control voltage such that the field-effect transistor structure is in the high-resistivity state; providing a drain voltage to generate a leakage current and sensing the leakage current to determine the memory state of the memory element.

Example 10 is a memory cell arrangement including at least one memory cell, the at least one memory cell including a field-effect transistor structure and a memory element. The memory element is configured to be switchable between at least a first memory state and a second memory state, the field-effect transistor structure and the memory element are configured such that the field-effect transistor structure is in a first resistivity state in the case that a control voltage is provided that is less than a first threshold voltage and such that the field-effect transistor structure is in a second resistivity state in the case that a gate-source voltage is applied that is greater than the first gate-source threshold voltage, and the field-effect transistor structure and the memory element are further configured such that, in the case that the memory element is in a second memory state, the field-effect transistor structure is in the first resistivity state in the case that a control voltage is applied that is less than a second threshold voltage and such that the field-effect transistor structure is in the second resistivity state in the case that a control voltage is applied that is greater than the second threshold voltage. The memory cell arrangement may further include a read-out circuit configured to carry out a read-out operation to read out the memory state of the memory element, the read-out operation including providing a control voltage such that the field-effect transistor structure is in the first resistivity state; providing a drain voltage to generate a leakage current and determining the memory state of the memory cell by sensing the leakage current.

In Example 11, the subject matter of Example 10 may optionally include that the control voltage is in a range from about 0 V to about 1 V (e.g., less than 0.5 V).

Example 12 is a memory cell arrangement including at least one memory cell, including a first terminal, a second terminal, and a third terminal. The at least one memory cell is configured to allow for a control of a current between the first terminal and the second terminal as a function of a first voltage that drops across the first terminal and the third terminal, a second voltage that drops across the first terminal and the second terminal, and a memory state of the memory cell. The memory cell arrangement may further include a read-out circuit configured to carry out a read-out operation to read out the memory state of the memory cell, the read-out operation including providing the first voltage such that an absolute value of the current is less than 0.1 µA; providing the second voltage such that a leakage current through the first terminal and/or through the second terminal is generated; sensing the leakage current to determine the memory state of the memory cell.

Example 13 is a memory cell arrangement including at least one memory cell, including a first terminal, a second terminal, and a third terminal. The at least one memory cell is configured to allow for a control of a current between the first terminal and the second terminal as a function of a first voltage that drops across the first terminal and the third terminal, a second voltage that drops across the first terminal and the second terminal, and a memory state of the memory cell. The memory cell arrangement may further include a read-out circuit configured to carry out a read-out operation to read out the memory state of the memory cell, the read-out operation including providing the first voltage and the second voltage such that no drift current between the first terminal and the second terminal is generated and that a leakage current through the first terminal and/or through the second terminal is generated; sensing the leakage current to determine the memory state of the memory cell.

Example 14 is a memory cell arrangement including at least one memory cell, including a first terminal, a second terminal, and a third terminal. The at least one memory cell is configured to allow for a control of a current between the first terminal and the second terminal as a function of a first voltage that drops across the first terminal and the third terminal, a second voltage that drops across the first terminal and the second terminal, and a memory state of the memory cell. The memory cell arrangement may further include a read-out circuit configured to carry out a read-out operation to read out the memory state of the memory cell, the read-out operation including providing the first voltage and the second voltage such that a leakage current through the first terminal and/or through the second terminal is generated and that the absolute value of the leakage current is greater than an absolute value of the current; sensing the leakage current to determine the memory state of the memory cell.

In Example 15, the subject matter of any one of Examples 12 to 14 may optionally include that the current and the leakage current are of opposite sign.

In Example 16, the subject matter of any one of Examples 12 to 15 may optionally include that the at least one memory cell includes a memory element, the memory element being writable into one of at least two memory states.

In Example 17, the subject matter of any one of Examples 1 to 11 or Example 16 may optionally include that the memory element includes a remanently-polarizable layer.

In Example 18, the subject matter of Example 17 may optionally include that the remanently-polarizable layer includes a ferroelectric material.

Example 19 is a memory cell arrangement including a plurality of memory cells, each memory cell of the plurality of memory cells including a corresponding first terminal, a corresponding second terminal, and a corresponding third terminal, each of the plurality of memory cells is configured to allow for a control of a respective drift current between the corresponding first terminal and the corresponding second terminal as a function of a first voltage that drops across the corresponding first terminal and the corresponding third terminal, a second voltage that drops across the corresponding first terminal and the corresponding second terminal, and a memory state of the memory cell, wherein each of the plurality of memory cells is associated with a respective first current/voltage characteristic describing the respective drift current between the corresponding first terminal and the corresponding second terminal in the case that the memory cell is in a first memory state, wherein one or more of the first current/voltage characteristics of the plurality of memory cells are at least partially different from other first current/voltage characteristics of the plurality of memory cells such that the first current/voltage characteristics of the plurality of memory cells provide a first current/voltage-distribution; wherein each of the plurality of memory cells is associated with a respective second current/voltage characteristic describing the respective drift current between the corresponding first terminal and the corresponding second terminal in the case that the memory cell is in a second memory state, wherein one or more of the second current/voltage characteristics of the plurality of memory cells are at least partially different from other second current/voltage characteristics of the plurality of memory cells such that the second current/voltage characteristics of the plurality of memory cells provide a second current/voltage-distribution; wherein the first current/voltage-distribution and the second current/voltage-distribution at least partially overlap. The memory cell arrangement may further include a read-out circuit configured to carry out a read-out operation to read out the memory state of a memory cell of the plurality of memory cells, the read-out operation including providing the first voltage and the second voltage such that no drift current between the corresponding first terminal and the corresponding second terminal is generated and that a leakage current through the corresponding first terminal and/or through the corresponding second terminal is generated; sensing the leakage current to determine the memory state of the memory element.

Example 20 is a memory cell arrangement including a plurality of memory cells, each memory cell of the plurality of memory cells including a field-effect transistor structure including a corresponding source region, a corresponding drain region, and a corresponding gate region, each of the plurality of memory cells is configured to allow for a control of a respective drift current between the corresponding source region and the corresponding drain region as a function of a first voltage that drops across the corresponding source region and the corresponding gate region, a second voltage that drops across the corresponding source region and the corresponding drain region, and a memory state of the memory cell; wherein each of the plurality of memory cells is associated with a respective first current/voltage characteristic describing the respective drift current between the corresponding source region and the corresponding drain region in the case that the memory cell is in a first memory state, wherein one or more of the first current/voltage characteristics of the plurality of memory cells are at least partially different from other first current/voltage characteristics of the plurality of memory cells such that the first current/voltage characteristics of the plurality of memory cells provide a first current/voltage-distribution; wherein each of the plurality of memory cells is associated with a respective second current/voltage characteristic describing the respective drift current between the corresponding source region and the corresponding drain region in the case that the memory cell is in a second memory state, wherein one or more of the second current/voltage characteristics of the plurality of memory cells are at least partially different from other second current/voltage characteristics of the plurality of memory cells such that the second current/voltage characteristics of the plurality of memory cells provide a second current/voltage-distribution; wherein the first current/voltage-distribution and the second current/voltage-distribution at least partially overlap. The memory cell arrangement may further include a read-out circuit configured to carry out a read-out operation to read out the memory state of a memory cell of the plurality of memory cells, the read-out operation including providing the first voltage and the second voltage such that no drift current between the corresponding source region and the corresponding drain region is generated and that a leakage current through the corresponding source region and/or through the corresponding drain region is generated; sensing the leakage current to determine the memory state of the memory element.

In Example 21, the subject matter of Example 20 may optionally include that the respective field-effect transistor structures of one or more memory cells of the plurality of memory cells may include at least one respective dimension such that the first current/voltage-distribution and the second current/voltage-distribution at least partially overlap.

In Example 22, the subject matter of Example 20 or 21 may optionally include that the respective field-effect transistor structures of one or more memory cells of the plurality of memory cells may include a respective first lateral dimension and/or a respective second lateral dimension such that the first current/voltage-distribution and the second current/voltage-distribution at least partially overlap.

In Example 23, the subject matter of Example 22 may optionally include that first lateral dimension and/or the second lateral dimension is less than 500 nm (e.g., less than 200 nm).

Example 24 is a memory cell arrangement including a plurality of memory cells, each memory cell of the plurality of memory cells including a field-effect transistor structure including a corresponding source region, a corresponding drain region, and a corresponding gate region, a memory element. The field-effect transistor structure and the memory element are configured such that a respective first gate-source threshold voltage is associated with the field-effect transistor structure in the case that the memory element is in a first memory state and that a respective second gate-source threshold voltage is associated with the field-effect transistor structure in the case that the memory element is in a second memory state; one or more of the first gate-source threshold voltages of the plurality of memory cells are at least partially different from other first gate-source threshold voltages of the plurality of memory cells such that the first gate-source threshold voltages of the plurality of memory cells provide a first distribution of gate-source threshold voltages; wherein one or more of the second gate-source threshold voltages of the plurality of memory cells are at least partially different from other second gate-source threshold voltages of the plurality of memory cells such that the second gate-source threshold voltages of the plurality of memory cells provide a second distribution of gate-source threshold voltages; wherein the first distribution of gate-source threshold voltages and the second distribution of gate-source threshold voltages at least partially overlap. The memory cell arrangement may further include a read-out circuit configured to carry out a read-out operation to read out the memory state of the memory element associated with a memory cell of the plurality of memory cells, the read-out operation including providing a gate-source voltage across the corresponding gate region and the corresponding source region, wherein a voltage value of the gate-source voltage is less than a voltage value of both the respective first gate-source threshold voltage and the respective second gate-source threshold voltage in the case that the field-effect transistor structure is an n-type field-effect transistor structure, and wherein a voltage value of the gate-source voltage is greater than a voltage value of both the respective first gate-source threshold voltage and the respective second gate-source threshold voltage in the case that the field-effect transistor structure is a p-type field-effect transistor structure; providing a drain voltage at the corresponding drain region of the field-effect transistor structure such that a leakage current is generated; sensing the leakage current to determine the memory state of the memory element.

In Example 25, the subject matter of Example 24 may optionally include that the respective first gate-source threshold voltage and the respective second gate-source threshold voltage are defined by a reference source-drain current and wherein the leakage current is less than the reference source-drain current.

In Example 26, the subject matter of Example 24 or 25 may optionally include that the respective field-effect transistor structures of one or more memory cells of the plurality of memory cells may include a respective first lateral dimension and/or a respective second lateral dimension such that the first distribution of gate-source threshold voltages and the second distribution of gate-source threshold voltages at least partially overlap.

In Example 27, the subject matter of Example 26 may optionally include that the first lateral dimension and/or the second lateral dimension is less than 500 nm (e.g., less than 200 nm).

In Example 28, the subject matter of any one of Examples 20 to 27 may optionally include that the memory cell further includes a first terminal connected to the source region and a second terminal connected to the drain region, and sensing the leakage current includes sensing the leakage current at the first terminal and/or the second terminal.

In Example 29, the subject matter of Example 28 may optionally include that sensing the leakage current includes sensing a first current at the first terminal and a second current at the second terminal and determining the leakage current using the first current and the second current.

In Example 30, the subject matter of Example 1 or any one of Examples 12 to 19 may optionally include that sensing the leakage current includes sensing the leakage current at the first terminal and/or the second terminal.

In Example 31, the subject matter of Example 30 may optionally include that sensing the leakage current includes sensing a first current at the first terminal and a second current at the second terminal and determining the leakage current using the first current and the second current.

Example 32 is a memory cell arrangement including at least one memory cell, the at least one memory cell including a first terminal, a second terminal; a third terminal; a field-effect transistor structure including a first source/drain region connected to the first terminal, a second source/drain region connected to the second terminal, and a gate structure connected to the third terminal. The gate structure includes a memory element. The memory cell arrangement may further include a read-out circuit configured to carry out a read-out operation to read out a memory state of the memory element, the read-out operation including: providing a first voltage at the first terminal, a second voltage at the second terminal, and a third voltage at the third terminal such that the field-effect transistor structure is in a high-resistivity state and such that a leakage current through the first terminal and through the second terminal is generated; and sensing the leakage current to determine the memory state of the memory element.

In Example 33, the subject matter of Example 32 may optionally include that sensing the leakage current includes sensing a first leakage current portion at the first terminal and a second leakage current portion at the second terminal.

Example 34 is a memory cell arrangement including at least one memory cell, the at least one memory cell including a first terminal, a second terminal; a third terminal; a fourth terminal; a field-effect transistor structure including a first source/drain region connected to the first terminal, a second source/drain region connected to the second terminal, a gate structure connected to the third terminal, and a bulk region connect to the fourth terminal. The gate structure includes a memory element. The memory cell arrangement may further include a read-out circuit configured to carry out a read-out operation to read out a memory state of the memory element, the read-out operation including: providing a first voltage at the first terminal, a second voltage at the second terminal a third voltage at the third terminal, and a fourth voltage at the fourth terminal such that the field-effect transistor structure is in a high-resistivity state and such that a leakage current through the fourth terminal is generated; and sensing the leakage current to determine the memory state of the memory element.

In Example 35, the subject matter of Example 34 may optionally include that sensing the leakage current includes sensing the leakage current at the third terminal and/or the fourth terminal.

Example 36 is a method for operating (e.g., read-out) a memory cell including a field-effect transistor structure, the method including applying a first voltage at a first terminal, a second voltage at a second terminal and a third voltage at a third terminal of the memory cell such that the field-effect transistor structure is in a high-resistivity state and that a leakage current through the first terminal and/or through the second terminal is generated, and sensing the leakage current to determine the memory state of the memory cell.

Example 37 is a method for operating (e.g., read-out) a memory cell, the method including applying a first voltage at a first terminal, a second voltage at a second terminal, and a third voltage at a third terminal of the memory cell such that no drift current is generated between the first terminal and the second terminal is generated and that a leakage current through the first terminal and/or through the second terminal is generated, sensing the leakage current to determine the memory state of the memory cell. In some aspects, the drift current between the first terminal and the second terminal may be determined by measuring the current that flows through the first terminal and/or the second terminal of the memory cell in the case that the field-effect transistor of the memory cell is turned on. The drift current may be determined from a current/voltage measurement, wherein a current is measured that flows through the first terminal and/or the second terminal of the memory cell as a function of a voltage (e.g., $V_G$s) that control the switching of the field-effect transistor of the memory cell.

In some aspects, a leakage current may be determined from a current/voltage measurement, wherein a current is measured that flows through the first terminal and/or the second terminal (or trough another terminal, e.g., the bulk terminal) of the memory cell as a function of a voltage (e.g., $V_G$s) that control the switching of the field-effect transistor of the memory cell.

Example 38 is a method for operating (e.g., read-out) a memory cell, the method including applying a gate-source voltage across a gate region and a source region of the memory cell, wherein a voltage value of the gate-source voltage is more negative than a voltage value of a gate-source threshold voltage associated with a memory state of the memory cell in the case that the field-effect transistor structure is an n-type field-effect transistor structure, and wherein a voltage value of the gate-source voltage is more positive than a voltage value of a gate-source threshold voltage associated with a memory state of the memory cell in the case that the field-effect transistor structure is a p-type field-effect transistor structure, providing a drain voltage at a drain region of the memory cell such that a leakage current is generated; sensing the leakage current to determine the memory state of the memory cell.

Example 39 is a memory cell arrangement, the memory cell arrangement including a plurality of memory cells, each memory cell of the plurality of memory cells including a first terminal, a second terminal, a third terminal, and a field-effect transistor structure including a first source/drain region connected to the first terminal, a second source/drain region connected to the second terminal, and a gate structure connected to the third terminal. The gate structure may include a memory element. The memory cell arrangement may further include a plurality of first control lines, a plurality of second control lines, a plurality of third control lines, and a plurality of access devices. Each memory cell of the plurality of memory cells may be associated with a first control line of the plurality of first control lines, a second control line of the plurality of second control lines connected to the second terminal of the memory cells, a third control line of the plurality of third control lines connected to the third terminal of the memory cell, and an access device of the plurality of access devices. Each access device of the plurality of access devices may be configured to connect the first terminal of the memory cell associated with the respective access device to the first control line of the plurality of first control lines associated with the memory cell. The memory cell arrangement may further include a read-out circuit configured to carry out a read-out operation to read out a memory cell of the plurality of memory cells by reading out a memory state of the memory element of the memory cell, the read-out operation including: providing a first voltage at the first control line associated with the memory cell, a second voltage at the second control line associated with the memory cell, and a third voltage at the third associated with the memory cell such that the field-effect transistor structure of the memory cell is in a high-resistivity state and such that a leakage current through the first terminal of the memory cell is generated; and sensing the leakage current at the first control line associated with the memory cell to determine the memory state of the memory element.

In Example 40, the subject matter of Example 39 may optionally include that each access device of the plurality of access devices is configured to connect the first terminal of the memory cell associated with the respective access device to the first control line of the plurality of first control lines associated with the memory cell controlled by a voltage applied at the third control line of the plurality of third control lines associated with the memory cell.

In Example 41, the subject matter of Example 39 may optionally include that the memory cell arrangement further includes a plurality of fourth control lines, where each access device of the plurality of access devices may be associated with a fourth control lines of the plurality of fourth control lines, and that each access device of the plurality of access devices is configured to connect the first terminal of the memory cell associated with the respective access device to the first control line of the plurality of first control lines associated with the memory cell controlled by a voltage applied at the fourth control line of the plurality of fourth control lines associated with the access device.

Example 42 is a memory cell arrangement, the memory cell arrangement including a plurality of memory cells, each memory cell of the plurality of memory cells including a first terminal, a second terminal, a third terminal, and a field-effect transistor structure including a first source/drain region connected to the first terminal, a second source/drain region connected to the second terminal, and a gate structure connected to the third terminal. The gate structure may include a memory element. The memory cell arrangement may further include a plurality of first control lines, a plurality of second control lines, a plurality of third control lines, and a plurality of access devices. Each memory cell of the plurality of memory cells may be associated with a first control line of the plurality of first control lines connected to the first terminal, a second control line of the plurality of second control lines, a third control line of the plurality of third control lines connected to the third terminal of the memory cell, and an access device of the plurality of access devices. Each access device of the plurality of access devices may be configured to connect the second terminal of the memory cell associated with the respective access device to the second control line of the plurality of second control lines associated with the memory cell. The memory cell arrangement may further include a read-out circuit configured to carry out a read-out operation to read out a memory cell of the plurality of memory cells by reading out a memory state of the memory element of the memory cell, the read-out operation including: providing a first voltage at the first control line associated with the memory cell, a second voltage at the second control line associated with the memory cell, and a third voltage at the third associated with the memory cell such that the field-effect transistor structure of the memory cell is in a high-resistivity state and such that a leakage current through the second terminal of the memory cell is generated; and sensing the leakage current at the second control line associated with the memory cell to determine the memory state of the memory element.

In Example 43, the subject matter of Example 42 may optionally include that each access device of the plurality of access devices is configured to connect the second terminal of the memory cell associated with the respective access device to the second control line of the plurality of second control lines associated with the memory cell controlled by a voltage applied at the third control line of the plurality of third control lines associated with the memory cell.

In Example 44, the subject matter of Example 42 may optionally include that the memory cell arrangement further includes a plurality of fourth control lines, where each access device of the plurality of access devices may be associated with a fourth control lines of the plurality of fourth control lines, and that each access device of the plurality of access devices is configured to connect the second terminal of the memory cell associated with the respective access device to the second control line of the plurality of second control lines associated with the memory cell controlled by a voltage applied at the fourth control line of the plurality of fourth control lines associated with the access device.

Example 45 is a memory cell arrangement, the memory cell arrangement including a plurality of memory cells, each memory cell of the plurality of memory cells including a first terminal, a second terminal, a third terminal, and a field-effect transistor structure including a first source/drain region connected to the first terminal, a second source/drain region connected to the second terminal, and a gate structure connected to the third terminal. The gate structure may include a memory element. The memory cell arrangement may further include a plurality of first control lines, a plurality of second control lines, a plurality of third control lines, a plurality of first access devices, and a plurality of second access devices. Each memory cell of the plurality of memory cells may be associated with a first control line of the plurality of first control lines, a second control line of the plurality of second control lines, a third control line of the plurality of third control lines connected to the third terminal of the memory cell, a first access device of the plurality of first access devices, and a second access device of the plurality of second access devices. Each first access device of the plurality of first access devices may be configured to connect the first terminal of the memory cell associated with the respective first access device to the first control line of the plurality of first control lines associated with the memory cell. Each second access device of the plurality of second access devices may be configured to connect the second terminal of the memory cell associated with the respective second access device to the second control line of the plurality of second control lines associated with the memory cell. The memory cell arrangement may further include a read-out circuit configured to carry out a read-out operation to read out a memory cell of the plurality of memory cells by reading out a memory state of the memory element of the memory cell, the read-out operation including: providing a first voltage at the first control line associated with the memory cell, a second voltage at the second control line associated with the memory cell, and a third voltage at the third associated with the memory cell such that the field-effect transistor structure of the memory cell is in a high-resistivity state and such that a first leakage current through the first terminal of the memory cell and/or a second leakage current through the second terminal of the memory cell is generated; and sensing the first leakage current at the first control line associated with the memory cell and/or the second leakage current at the second control line associated with the memory cell to determine the memory state of the memory element.

Example 46 is a memory cell arrangement including: a memory cell, the memory cell including: a first terminal, a second terminal, a third terminal, a fourth terminal, and a field-effect transistor structure including a first source/drain region connected to the first terminal, a second source/drain region connected to the second terminal, and a gate structure. The gate structure may include a first gate electrode connected to the third terminal, a second gate electrode connected to the fourth terminal, a first memory element coupled to the third terminal, and a second memory element coupled to the fourth terminal. The memory cell arrangement may further include a read-out circuit configured to carry out a first read-out operation to read out a memory state of the first memory element and/or to carry out a second read-out operation to read out a memory state of the second memory element. The first read-out operation may include: providing a first voltage at the first terminal and a third voltage at the third terminal such that the field-effect transistor structure is in a high-resistivity state and such that a first leakage current through the first terminal is generated; and sensing the first leakage current to determine the memory state of the first memory element. The second read-out operation may include: providing a second voltage at the second terminal and a fourth voltage at the fourth terminal such that the field-effect transistor structure is in a high-resistivity state and such that a second leakage current through the second terminal is generated; and sensing the second leakage current to determine the memory state of the second memory element.

Example 47 is a memory cell arrangement including at least one memory cell, the at least one memory cell including: a first terminal; a second terminal; and a field-effect transistor structure including a source/drain region connected to the first terminal, a channel portion connected to the source/drain region, and a gate structure connected to the second terminal. The gate structure may include a memory element. The memory cell arrangement may further include a read-out circuit configured to carry out a read-out operation to read out a memory state of the memory element, the read-out operation including: providing at least a first voltage at the first terminal and a second voltage at the second terminal such that the channel portion of the field-effect transistor structure is in a high-resistivity state and such that a leakage current through the first terminal is generated; and sensing the leakage current to determine the memory state of the memory element.

In Example 48, the subject matter of Example 47 may optionally include that the field-effect transistor structure is an n-type field-effect transistor structure, and that a voltage value of a voltage difference between the second voltage and the first voltage is less than 1 V or is negative (less than 0 V).

In Example 49, the subject matter of Example 47 may optionally include that the field-effect transistor structure is a p-type field-effect transistor structure, and that a voltage value of a voltage difference between the second voltage and the first voltage is greater than −1 V or is positive (greater than 0 V).

In Example 50, the subject matter of any one of Examples 47 to 49 may optionally include that the field-effect transistor structure further includes a bulk region and that the memory cell includes a fourth terminal. The bulk region of the field-effect transistor structure may be connected to the fourth terminal and the generated leakage current may flow through the fourth terminal (e.g., from the first terminal to the fourth terminal, or vice versa).

In Example 51, the subject matter of any one of Examples 1 to 35 may optionally include that the field-effect transistor structure includes a low-resistivity state and that the field effect transistor structure can be switched between the low-resistivity state and the high-resistivity state as a function of one or more voltages applied at the first terminal, at the second terminal, and/or at the third terminal.

In Example 52, the subject matter of any one of Examples 1 to 35 or Example 51 may optionally include that the field-effect transistor structure includes a bulk region connected to a fourth terminal, and that the generated leakage current flows through the fourth terminal.

In Example 53, the subject matter of any one of Examples 1 to 35 or the subject matter of Example 51 or 52 may optionally include that the field-effect transistor structure includes a channel region extending from the first source/drain region to the second source/drain region. The channel region may be in a non-conductive state in the case that the field-effect transistor structure is in the high-resistivity state.

In Example 54, the subject matter of Example 53 may optionally include that, in the non-conductive state, a resistance value associated with the channel region is greater than 1 MΩ.

In Example 55, the subject matter of any one of Examples 1 to 35 or the subject matter of any one of Examples 51 to 54 may optionally include that the field-effect transistor structure is an n-type field-effect transistor structure. A voltage value of a voltage difference between the third voltage and the first voltage may be more negative than a voltage value of a threshold voltage associated with the memory state of the memory element. A voltage value of a voltage difference between the third voltage and the first voltage may be negative.

In Example 56, the subject matter of any one of Examples 1 to 35 or the subject matter of any one of Examples 51 to 55 may optionally include that the field-effect transistor structure is a p-type field-effect transistor structure. A voltage value of a voltage difference between the third voltage and the first voltage may be more positive than a voltage value of a threshold voltage associated with the memory state of the memory element. A voltage value of a voltage difference between the third voltage and the first voltage may be positive.

In Example 57, the subject matter of any one of Examples 1 to 35 or the subject matter of any one of Examples 51 to 56 may optionally include that the memory cell arrangement further includes a plurality of additional memory cells. Each memory cell of the plurality of additional memory cells may include: a first terminal; a second terminal; a third terminal; and a field-effect transistor structure including a first source/drain region connected to the first terminal, a second source/drain region connected to the second terminal, and a gate structure connected to the third terminal, wherein the gate structure includes a memory element.

In Example 58, the subject matter of Example 57 may optionally include that the memory cell and each of the plurality of additional memory cells have a first distribution of first threshold voltage values associated therewith in the case that the respective memory cells are in a first memory state and a second distribution of second threshold voltage values associated therewith in the case that the respective memory cells are in a second memory state.

In Example 59, the subject matter of Example 58 may optionally include that a gate of the field-effect transistor structure has a footprint such that the first distribution and the second distribution at least partially overlap.

In Example 60, the subject matter of Example 59 may optionally include that the footprint is less than 0.1 µm².

In Example 61, the subject matter of any one of Examples 1 to 35 or the subject matter of any one of Examples 51 to 60 may optionally include that a lateral dimension of the gate of the field-effect transistor structure is less than 250 nm.

In Example 62, the subject matter of any one of Examples 1 to 35 or the subject matter of any one of Examples 51 to 61 may optionally include that, in the case that the leakage current is sensed through the first terminal, the first voltage provided at the first terminal has an absolute voltage value in a range from about 0.1 V to about 10 V.

In Example 63, the subject matter of any one of Examples 1 to 35 or the subject matter of any one of Examples 51 to 62 may optionally include that, in the case that the leakage current is sensed through the second terminal, the second voltage provided at the second terminal has an absolute voltage value in a range from about 0.1 V to about 10 V.

In Example 64, the subject matter of any one of Examples 1 to 35 or the subject matter of any one of Examples 51 to 63 may optionally include that sensing the leakage current to determine the memory state of the memory element includes sensing a sum of a first leakage current portion that flows through the first terminal and a second first leakage current portion that flows through the second terminal, and determining the memory state of the memory element based on the sum of the first leakage current portion and the second leakage current portion.

In Example 65, the subject matter of any one of Examples 47 to 50 may optionally include that the memory cell further includes a third terminal. The field-effect transistor structure may further include a second source/drain region connected to the third terminal, and the channel portion may be connected to the second source/drain region such that the channel portion extends from the source/drain region to the second source/drain region. Providing at least a first voltage at the first terminal and a second voltage at the second terminal may include providing a first voltage at the first terminal, a second voltage at the second terminal, and a third voltage at the third terminal such that the channel portion of the field-effect transistor structure is in a high-resistivity state and such that the leakage current through the first terminal and/or through the third terminal is generated.

In Example 66, the subject matter of any one of Examples 47 to 50 may optionally include that the memory cell further includes a third terminal. The field-effect transistor structure may further include a second source/drain region connected to the third terminal, and the channel portion may be not electrically conductively connected to the second source/drain region.

It is noted that aspects described herein with reference to a three or four terminal field-effect transistor structure may also apply for the two terminal field-effect transistor structure described herein, e.g., described in Examples 47 to 49.

It is further noted that the present disclosure refers to a field-effect transistor structure also in the case that a structure only includes two terminals since a gate structure and one other terminal that are substantially similar to a field-effect transistor are considered. Please further note that the present disclosure refers to a field-effect transistor structure also in the case that a structure does not include a complete channel since a gate structure and at least one source/drain region substantially similar to a field-effect transistor is considered.

It is noted that one or more functions described herein with reference to a memory cell, a remanent polarizable portion, a memory cell arrangement, etc., may be accordingly part of a method, e.g., part of a method for reading a memory cell of the memory cell arrangement. Vice versa, one or more functions described herein with reference to a method, e.g., with reference to a method for reading a memory cell of a memory cell arrangement, may be implemented accordingly in a device or in a part of a device, for example, in a remanent polarizable portion, a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell arrangement, comprising:
   a memory cell, the memory cell comprising:
   a first terminal;
   a second terminal;
   a third terminal;
   a field-effect transistor structure comprising a first source/drain region connected to the first terminal, a second source/drain region connected to the second terminal, and a gate structure connected to the third terminal, wherein the gate structure comprises a memory element; and
   a read-out circuit configured to carry out a read-out operation to read out a memory state of the memory element, the read-out operation comprising:
   providing a first voltage at the first terminal, a second voltage at the second terminal, and a third voltage at the third terminal such that the field-effect transistor structure is in a high-resistivity state and such that a leakage current through the first terminal and/or through the second terminal is generated; and
   sensing the leakage current to determine the memory state of the memory element;
   wherein the field-effect transistor structure comprises a channel region extending from the first source/drain region to the second source/drain region, wherein the channel region is in a non-conductive state in the case that the field-effect transistor structure is in the high-resistivity state, wherein, in the non-conductive state, a resistance value associated with the channel region is greater than 1 $M\Omega$.

2. The memory cell arrangement of claim 1,
   wherein no substantial drift current occurs between the first terminal and the second terminal in the case that the field-effect transistor structure is in the high-resistivity state, and
   wherein the field-effect transistor structure comprises a low-resistivity state and can be switched between the low-resistivity state and the high-resistivity state as a function of one or more voltages applied at the first terminal, at the second terminal, and/or at the third terminal.

3. The memory cell arrangement of claim 1,
   wherein the field-effect transistor structure comprises a bulk region connected to a fourth terminal, and wherein the generated leakage current flows through the fourth terminal.

4. The memory cell arrangement of claim 1,
   wherein an absolute value of a voltage difference between the first voltage and the third voltage is in a range from about 0 V to about 1 V; or
   wherein the field-effect transistor structure is an n-type field-effect transistor structure, wherein a voltage value of a voltage difference between the third voltage and the first voltage is more negative than a voltage value of a threshold voltage associated with the memory state of the memory element or wherein a voltage value of a voltage difference between the third voltage and the first voltage is negative; or
   wherein the field-effect transistor structure is a p-type field-effect transistor structure, wherein a voltage value of a voltage difference between the third voltage and the first voltage is more positive than a voltage value of a threshold voltage associated with the memory state of the memory element or wherein a voltage value of a voltage difference between the third voltage and the first voltage is positive.

5. The memory cell arrangement of claim 1,
   wherein the memory element comprises one or more remanently-polarizable layers.

6. The memory cell arrangement of claim 1, further comprising:
   a plurality of additional memory cells, each memory cell of the plurality of additional memory cells comprising:
   a first terminal;
   a second terminal;
   a third terminal;
   a field-effect transistor structure comprising a first source/drain region connected to the first terminal, a second source/drain region connected to the second terminal, and a gate structure connected to the third terminal, wherein the gate structure comprises a memory element.

7. The memory cell arrangement of claim 6,
   wherein the memory cell and each of the plurality of additional memory cells have a first distribution of first threshold voltage values associated therewith in the case that the respective memory cells are in a first memory state and a second distribution of second threshold voltage values associated therewith in the case that the respective memory cells are in a second memory state.

8. The memory cell arrangement of claim 7,
wherein a gate of the field-effect transistor structure has a footprint such that the first distribution and the second distribution at least partially overlap.

9. The memory cell arrangement of claim 8,
wherein the footprint is less than 0.1 µm².

10. The memory cell arrangement of claim 1,
wherein a lateral dimension of the gate of the field-effect transistor structure is less than 250 nm.

11. The memory cell arrangement of claim 1,
wherein, in the case that the leakage current is sensed through the first terminal, the first voltage provided at the first terminal has an absolute voltage value in a range from about 0.1 V to about 10 V; or
wherein, in the case that the leakage current is sensed through the second terminal, the second voltage provided at the second terminal has an absolute voltage value in a range from about 0.1 V to about 10 V.

12. The memory cell arrangement of claim 1,
wherein sensing the leakage current to determine the memory state of the memory element comprises sensing a sum of a first leakage current portion that flows through the first terminal and a second first leakage current portion that flows through the second terminal, and determining the memory state of the memory element based on the sum of the first leakage current portion and the second leakage current portion.

13. A memory cell arrangement, comprising:
a memory cell, the memory cell comprising:
a first terminal;
a second terminal;
a third terminal;
a field-effect transistor structure comprising a first source/drain region connected to the first terminal, a second source/drain region connected to the second terminal, and a gate structure connected to the third terminal, wherein the gate structure comprises a memory element; and
a read-out circuit configured to carry out a read-out operation to read out a memory state of the memory element, the read-out operation comprising:
providing a first voltage at the first terminal, a second voltage at the second terminal, and a third voltage at the third terminal such that the field-effect transistor structure is in a high-resistivity state and such that a leakage current through the first terminal and/or through the second terminal is generated;
sensing the leakage current to determine the memory state of the memory element; and
a plurality of additional memory cells, each memory cell of the plurality of additional memory cells comprising:
a first terminal;
a second terminal;
a third terminal;
a field-effect transistor structure comprising a first source/drain region connected to the first terminal, a second source/drain region connected to the second terminal, and a gate structure connected to the third terminal, wherein the gate structure comprises a memory element,
wherein the memory cell and each of the plurality of additional memory cells have a first distribution of first threshold voltage values associated therewith in the case that the respective memory cells are in a first memory state and a second distribution of second threshold voltage values associated therewith in the case that the respective memory cells are in a second memory state,
wherein a gate of the field-effect transistor structure has a footprint such that the first distribution and the second distribution at least partially overlap,
wherein the footprint is less than 0.1 µm².

14. The memory cell arrangement of claim 13,
wherein no substantial drift current occurs between the first terminal and the second terminal in the case that the field-effect transistor structure is in the high-resistivity state, and
wherein the field-effect transistor structure comprises a low-resistivity state and can be switched between the low-resistivity state and the high-resistivity state as a function of one or more voltages applied at the first terminal, at the second terminal, and/or at the third terminal.

15. The memory cell arrangement of claim 13,
wherein the field-effect transistor structure comprises a bulk region connected to a fourth terminal, and wherein the generated leakage current flows through the fourth terminal.

16. The memory cell arrangement of claim 13,
wherein an absolute value of a voltage difference between the first voltage and the third voltage is in a range from about 0 V to about 1 V; or
wherein the field-effect transistor structure is an n-type field-effect transistor structure, wherein a voltage value of a voltage difference between the third voltage and the first voltage is more negative than a voltage value of a threshold voltage associated with the memory state of the memory element or wherein a voltage value of a voltage difference between the third voltage and the first voltage is negative; or
wherein the field-effect transistor structure is a p-type field-effect transistor structure, wherein a voltage value of a voltage difference between the third voltage and the first voltage is more positive than a voltage value of a threshold voltage associated with the memory state of the memory element or wherein a voltage value of a voltage difference between the third voltage and the first voltage is positive.

17. The memory cell arrangement of claim 13,
wherein the memory element comprises one or more remanently-polarizable layers.

18. The memory cell arrangement of claim 13,
wherein a lateral dimension of the gate of the field-effect transistor structure is less than 250 nm.

19. The memory cell arrangement of claim 13,
wherein, in the case that the leakage current is sensed through the first terminal, the first voltage provided at the first terminal has an absolute voltage value in a range from about 0.1 V to about 10 V; or
wherein, in the case that the leakage current is sensed through the second terminal, the second voltage provided at the second terminal has an absolute voltage value in a range from about 0.1 V to about 10 V.

20. The memory cell arrangement of claim 13,
wherein sensing the leakage current to determine the memory state of the memory element comprises sensing a sum of a first leakage current portion that flows through the first terminal and a second first leakage current portion that flows through the second terminal, and determining the memory state of the memory element based on the sum of the first leakage current portion and the second leakage current portion.

21. A memory cell arrangement, comprising:
a memory cell, the memory cell comprising:
a first terminal;
a second terminal;
a third terminal;
a field-effect transistor structure comprising a first source/drain region connected to the first terminal, a second source/drain region connected to the second terminal, and a gate structure connected to the third terminal, wherein the gate structure comprises a memory element; and
a read-out circuit configured to carry out a read-out operation to read out a memory state of the memory element, the read-out operation comprising:
providing a first voltage at the first terminal, a second voltage at the second terminal, and a third voltage at the third terminal such that the field-effect transistor structure is in a high-resistivity state and such that a leakage current through the first terminal and/or through the second terminal is generated;
sensing the leakage current to determine the memory state of the memory element; and
wherein sensing the leakage current to determine the memory state of the memory element comprises sensing a sum of a first leakage current portion that flows through the first terminal and a second first leakage current portion that flows through the second terminal, and determining the memory state of the memory element based on the sum of the first leakage current portion and the second leakage current portion.

22. The memory cell arrangement of claim 21,
wherein no substantial drift current occurs between the first terminal and the second terminal in the case that the field-effect transistor structure is in the high-resistivity state, and
wherein the field-effect transistor structure comprises a low-resistivity state and can be switched between the low-resistivity state and the high-resistivity state as a function of one or more voltages applied at the first terminal, at the second terminal, and/or at the third terminal.

23. The memory cell arrangement of claim 21,
wherein the field-effect transistor structure comprises a bulk region connected to a fourth terminal, and wherein the generated leakage current flows through the fourth terminal.

24. The memory cell arrangement of claim 21,
wherein an absolute value of a voltage difference between the first voltage and the third voltage is in a range from about 0 V to about 1 V; or
wherein the field-effect transistor structure is an n-type field-effect transistor structure, wherein a voltage value of a voltage difference between the third voltage and the first voltage is more negative than a voltage value of a threshold voltage associated with the memory state of the memory element or wherein a voltage value of a voltage difference between the third voltage and the first voltage is negative; or
wherein the field-effect transistor structure is a p-type field-effect transistor structure, wherein a voltage value of a voltage difference between the third voltage and the first voltage is more positive than a voltage value of a threshold voltage associated with the memory state of the memory element or wherein a voltage value of a voltage difference between the third voltage and the first voltage is positive.

25. The memory cell arrangement of claim 21,
wherein the memory element comprises one or more remanently-polarizable layers.

26. The memory cell arrangement of claim 21,
wherein a lateral dimension of the gate of the field-effect transistor structure is less than 250 nm.

27. The memory cell arrangement of claim 21,
wherein, in the case that the leakage current is sensed through the first terminal, the first voltage provided at the first terminal has an absolute voltage value in a range from about 0.1 V to about 10 V; or
wherein, in the case that the leakage current is sensed through the second terminal, the second voltage provided at the second terminal has an absolute voltage value in a range from about 0.1 V to about 10 V.

28. A memory cell arrangement, comprising:
a memory cell, the memory cell comprising:
a first terminal;
a second terminal;
a third terminal;
a field-effect transistor structure comprising a first source/drain region connected to the first terminal, a second source/drain region connected to the second terminal, and a gate structure connected to the third terminal, wherein the gate structure comprises a memory element; and
a read-out circuit configured to carry out a read-out operation to read out a memory state of the memory element, the read-out operation comprising:
providing a first voltage at the first terminal, a second voltage at the second terminal, and a third voltage at the third terminal such that the field-effect transistor structure is in a high-resistivity state and such that a leakage current through the first terminal and/or through the second terminal is generated; and
sensing the leakage current to determine the memory state of the memory element,
wherein a gate of the field-effect transistor structure has a footprint less than 0.1 $\mu m^2$.

29. The memory cell arrangement of claim 28,
wherein no substantial drift current occurs between the first terminal and the second terminal in the case that the field-effect transistor structure is in the high-resistivity state, and
wherein the field-effect transistor structure comprises a low-resistivity state and can be switched between the low-resistivity state and the high-resistivity state as a function of one or more voltages applied at the first terminal, at the second terminal, and/or at the third terminal.

30. The memory cell arrangement of claim 28,
wherein the field-effect transistor structure comprises a bulk region connected to a fourth terminal, and wherein the generated leakage current flows through the fourth terminal.

31. The memory cell arrangement of claim 28,
wherein the field-effect transistor structure comprises a channel region extending from the first source/drain region to the second source/drain region, wherein the channel region is in a non-conductive state in the case that the field-effect transistor structure is in the high-resistivity state.

32. The memory cell arrangement of claim 31,
wherein, in the non-conductive state, a resistance value associated with the channel region is greater than 1 M$\Omega$.

33. The memory cell arrangement of claim 28,
wherein an absolute value of a voltage difference between the first voltage and the third voltage is in a range from about 0 V to about 1 V; or
wherein the field-effect transistor structure is an n-type field-effect transistor structure, wherein a voltage value of a voltage difference between the third voltage and the first voltage is more negative than a voltage value of a threshold voltage associated with the memory state of the memory element or wherein a voltage value of a voltage difference between the third voltage and the first voltage is negative; or
wherein the field-effect transistor structure is a p-type field-effect transistor structure, wherein a voltage value of a voltage difference between the third voltage and the first voltage is more positive than a voltage value of a threshold voltage associated with the memory state of the memory element or wherein a voltage value of a voltage difference between the third voltage and the first voltage is positive.

34. The memory cell arrangement of claim 28,
wherein the memory element comprises one or more remanently-polarizable layers.

35. The memory cell arrangement of claim 28,
wherein a lateral dimension of the gate of the field-effect transistor structure is less than 250 nm.

36. The memory cell arrangement of claim 28,
wherein, in the case that the leakage current is sensed through the first terminal, the first voltage provided at the first terminal has an absolute voltage value in a range from about 0.1 V to about 10 V; or
wherein, in the case that the leakage current is sensed through the second terminal, the second voltage provided at the second terminal has an absolute voltage value in a range from about 0.1 V to about 10 V.

37. The memory cell arrangement of claim 28,
wherein sensing the leakage current to determine the memory state of the memory element comprises sensing a sum of a first leakage current portion that flows through the first terminal and a second first leakage current portion that flows through the second terminal, and determining the memory state of the memory element based on the sum of the first leakage current portion and the second leakage current portion.

* * * * *